US006915504B2

(12) United States Patent
Okada

(10) Patent No.: US 6,915,504 B2
(45) Date of Patent: Jul. 5, 2005

(54) METHOD FOR DESIGNING ARITHMETIC DEVICE ALLOCATION

(75) Inventor: Kazuhisa Okada, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 142 days.

(21) Appl. No.: 10/230,063

(22) Filed: Aug. 29, 2002

(65) Prior Publication Data

US 2003/0101429 A1 May 29, 2003

(30) Foreign Application Priority Data

Aug. 31, 2001 (JP) ........................................ 2001-264287

(51) Int. Cl.$^7$ ............................................ G06F 17/50
(52) U.S. Cl. ................................. 716/18; 716/3; 716/2; 716/7; 703/16
(58) Field of Search .............................. 716/18, 3, 2, 7; 703/16

(56) References Cited

U.S. PATENT DOCUMENTS

| | | | | |
|---|---|---|---|---|
| 5,841,663 | A | * | 11/1998 | Sharma et al. ................. 716/18 |
| 6,028,987 | A | * | 2/2000 | Hirairi ............................ 716/3 |
| 6,360,355 | B1 | * | 3/2002 | Nishida et al. ................ 716/18 |
| 6,397,341 | B1 | * | 5/2002 | Genevriere ................... 713/400 |
| 6,438,739 | B1 | * | 8/2002 | Yamada ......................... 716/18 |
| 6,557,157 | B1 | * | 4/2003 | Bothel ........................... 716/18 |
| 6,594,814 | B1 | * | 7/2003 | Jou et al. ....................... 716/18 |
| 6,604,232 | B2 | * | 8/2003 | Okada et al. .................. 716/18 |
| 6,622,287 | B1 | * | 9/2003 | Henkel ............................ 716/2 |
| 2001/0016936 | A1 | * | 8/2001 | Okada et al. .................. 716/18 |

FOREIGN PATENT DOCUMENTS

JP     2000-242669     9/2000     ........... G06F/17/50

OTHER PUBLICATIONS

Kim et al., "An Area Efficient DCT Architecture for MPEG–2 Video Encoder", IEEE Transactions on Consumer Electronics, vol. 45, No. 1, Feb. 1999, pp. 62–67.*

Togawa et al., "A Hardware/Software Partitioning Algorithm for Digital Signal Processor Cores With Two Types of Register Files", The 2000 IEEE Asia–Pacific Conference on Circuits and Systems, Dec. 4, 2000, pp. 544–547.*

Satyanarayana et al., "FLIGHT: A Novel Approach to the High–Level Synthesis of Digital–Serial Digital Filters", Proceedings of the 37th Midwest Symposium on Circuits and Systems, vol. 1, Aug. 3, 1994, pp. 335–338.*

Um et al., "Utilization of Carry–Save–Adders in Arithmetic Optimization", Twelfth Annual IEEE International ASIC/SOC Conference, Sep. 15, 1999, pp. 173–177.*

* cited by examiner

Primary Examiner—Leigh M. Garbowski
Assistant Examiner—Phallaka Kik
(74) Attorney, Agent, or Firm—Birch, Stewart, Kolasch & Birch, LLP

(57) ABSTRACT

An arithmetic device allocation design method of the present invention includes the steps of: in the case of allocating an arithmetic operation A to the arithmetic device, comparing an increased circuit area due to a selector to be provided so as to allocate the operation A to an arithmetic device C to which another arithmetic operation B has already been allocated and an increased area due to an arithmetic device D to be created anew to which only the operation A is allocated; when the increased circuit area due to the selector is smaller, allocating the operation A to the device C to which the another operation B has already been allocated while providing the selector; and when the increased circuit area due to the device D is smaller, creating the device D anew so as to allocate the operation A to the device D created anew.

2 Claims, 23 Drawing Sheets

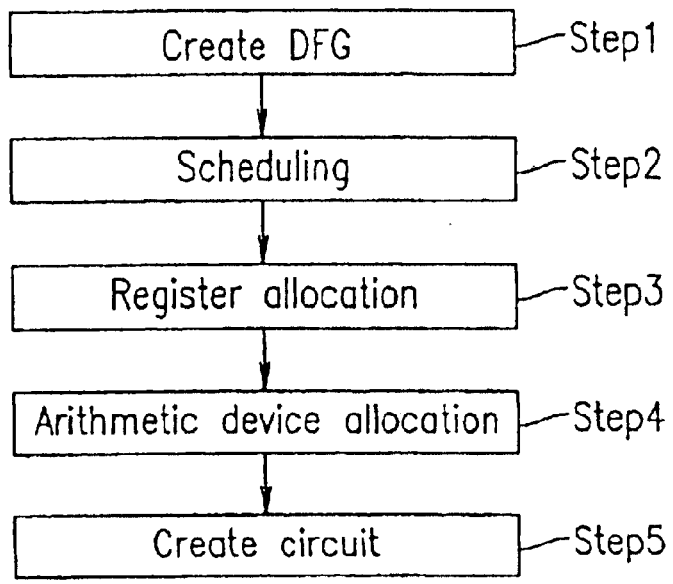
FIG. 1
CONVENTIONAL ART
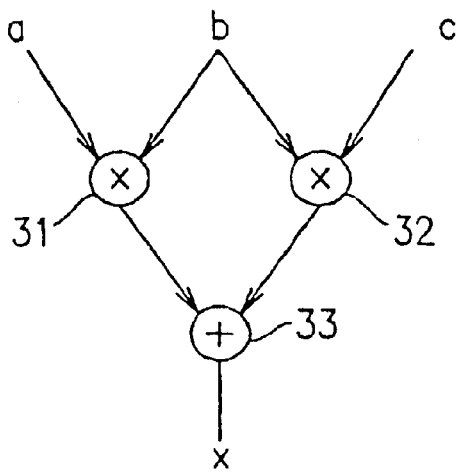
FIG. 2 RELATED ART
x = (a × b) + (b × c);
FIG. 3 RELATED ART Area 24

Area 27

Pre-arithmetic operation

Focused arithmetic operation

Post-arithmetic operation

Pre-arithmetic operation

Focused arithmetic operation

Post-arithmetic operation

Pre-arithmetic operation

Focused arithmetic operation

Post-arithmetic operation

METHOD FOR DESIGNING ARITHMETIC DEVICE ALLOCATION

BACKGROUND OF THE INVENTION

1. Field of the Invention

The present invention relates to a method for designing arithmetic device allocation in which arithmetic operations in a data flow graph are allocated to arithmetic devices based on a scheduling result when performing high-level synthesis for automatically synthesizing a digital circuit from behavioral descriptions of an LSI circuit.

2. Description of the Related Art

Conventionally, high-level synthesis technologies are known as useful technologies for designing an LSI (Large Scale Integration) circuit in a short period of time. The high-level synthesis technologies are technologies for automatically synthesizing a circuit from behavioral descriptions which do not include information about a hardware structure and only includes a processing algorithm. For example, "High-Level Synthesis", Kluwer Academic Publishers, is one publication including detailed description of conventional high-level synthesis technologies.

A brief description is given below with respect to a process of automatically synthesizing a circuit from behavioral descriptions using a conventional high-level synthesis technology. The high-level synthesis is performed according to a procedure shown in FIG. 1.

Firstly, at step 1, a flow of data in behavioral descriptions is analyzed so as to create a model referred to as a "data flow graph" (DFG). The DFG is a graph similar to a flowchart of a program and includes nodes and branches. The branches and nodes respectively represent data and arithmetic operations. An input of an arithmetic operation corresponds to an input branch of a node and an output of an arithmetic operation corresponds to an output branch of a node.

For example, a behavioral description shown in FIG. 2 is represented by a DFG shown in FIG. 3. The DFG of FIG. 3 includes nodes 31 and 32 representing two multiplications and a node 33 representing an addition, and represents that a result of multiplication of inputs a and b and a result of multiplication of inputs b and c are added together so as to output an arithmetic operation result x.

Next, at step 2 of FIG. 1, scheduling is performed so as to determine when to perform arithmetic operations corresponding to the nodes in the DFG, i.e., it is determined which arithmetic operation is performed in which clock cycle. In this case, it is necessary to include all the nodes in the DFG in a clock period in consideration of delay times of all the arithmetic operations.

Examples of scheduling of the DFG shown in FIG. 3 are shown in FIGS. 4 and 6. In FIG. 4, the DFG is scheduled such that two multiplications and an addition are performed in a single clock cycle (cycle 1). For example, in the case where delay times of an adder and a multiplier are respectively 5 nanoseconds (ns) and 60 ns, when a clock period is equal to or more than 65 ns, the DFG can be scheduled as shown in FIG. 4.

In FIG. 6, the DFG is scheduled such that a single multiplication 61 is performed in cycle 1 and the rest of the arithmetic operations, i.e., a multiplication 62 and an addition 65, are performed in cycle 2. The scheduling shown in FIG. 6 is also possible when the clock period is equal to or more than 65 ns. In FIG. 6, data represented by a branch 63 crossing a border of a clock cycle is stored in a register R1 and data represented by a branch 64 crossing the border of a clock cycle is stored in a register (not shown) which preserves constant b.

The scheduling result shown in FIG. 4 can be realized by the circuit shown in FIG. 5. The circuit of FIG. 5 includes two multipliers and an adder. Inputs a and b are input to one of the two multipliers so as to be multiplied together, and inputs b and c are input to the other one of the two multipliers so as to be multiplied together. The results of the multiplications performed by both of the two multipliers are input to the adder so as to be added together, so that an operation result x is output.

On the other hand, the scheduling result shown in FIG. 6 can be realized by the circuit shown in FIG. 7. The circuit of FIG. 7 includes a selector (sel) 71, a multiplier 75, an adder 74, a register 72 and a controller 73.

The selector 71 outputs a left-side input, i.e., input a, when a select signal 76 indicated by a dotted arrow corresponds to 1, and outputs a right-side input, i.e., input c when the select signal 76 corresponds to 0. The register 72 stores a value of an input at the instant of the rise of a clock when an enable signal 77 indicated by another dotted arrow corresponds to 1, and retains a value stored therein when the enable signal 77 corresponds to 0. Then, the register 72 outputs the stored (or retained) value. The controller 73 generates the signals 76 and 77 to respectively control the selector 71 and the register 72.

The operation of the circuit of FIG. 7 is now described. In cycle 1 (FIG. 6), both the selector signal 76 and the enable signal 77 correspond to 1, and therefore the register 72 stores a value of multiplication (a×b). In cycle 2 (FIG. 6), both the selector signal 76 and the enable signal 77 correspond to 0, and therefore multiplication (c×b) is calculated so that the adder 74 receives the result of the multiplication (c×b), and the value of the multiplication (a×b) stored in the register 72 is output to the adder 74 so as to be added to the result of the multiplication (c×b). The adder 74 outputs the additional result x.

The circuit of FIG. 5 completes an operation thereof in one cycle, but two multipliers are required. On the other hand, the circuit of FIG. 7 requires two cycles for completing an operation thereof, but only one multiplier is required. In the high-level synthesis technologies, it is possible to synthesize the circuit of FIG. 5 when a high-speed circuit is required and the circuit of FIG. 7 when a circuit having a small area is required.

Next, at step 3 of FIG. 1, register allocation is performed. In the scheduling result shown in FIG. 6, it is necessary to store in a register data represented by a branch crossing the border of the clock cycle, such as the branches 63 and 64. The reason for this is that in a synchronous circuit, a value of a register is changed for each clock cycle. For example, in order to use the calculation result (a×b) of the multiplication 61 for the addition 65, the calculation result (a×b) is required to be temporarily stored in the register at the border of the clock cycle. In the register allocation, a register is allocated to such a branch crossing a border of each clock cycle. In the following description, a register allocation result refers to register(s) each represented by a rectangle including a name of the register, e.g., reference numeral 66 in FIG. 6 denotes a register having a name R1. A register for preserving a value of variable b can be used as a register for the branch 64, but such a register for the branch 64 is not shown in FIG. 7.

Next, at step 4 of FIG. 1, arithmetic device allocation for allocating arithmetic operations in a DFG to arithmetic devices based on scheduling and register results is performed. In the scheduling result shown in FIG. 6, two multiplications 61 and 62 can be performed while sharing a single multiplier 75 shown in FIG. 7. However, in the case where there are a plurality of methods for sharing an arithmetic device between arithmetic operations, a procedure for determining an optimum sharing method is required. This procedure is referred to as the "arithmetic device allocation".

In conventional arithmetic device allocation design methods (for example, see "High-Level Synthesis", Kluwer Academic Publishers, Japanese Laid-Open Patent Publication No. 2000-242669, etc.), as in the case of allocating the two multiplications 61 and 62 of FIG. 6 to the single multiplier 75 of FIG. 7, reduction in circuit area is achieved by allocating arithmetic operations to arithmetic devices such that the number of arithmetic devices to be used becomes as small as possible.

Next, at step 5 of FIG. 1, a circuit at an RTL (Register Transfer Level), which includes hardware structures, such as registers, arithmetic devices, etc. and processes data flowing between the registers for each operation cycle, is created by creating data paths based on branches in the DFG and a control logic for controlling the registers, selectors, etc.

In the conventional arithmetic device allocation design methods, the arithmetic operations are allocated to the arithmetic devices such that the number of arithmetic devices to be used becomes as small as possible, and therefore when performing the arithmetic device allocation based on the scheduling and register allocation results shown in FIG. 6, the arithmetic device allocation result shown in FIG. 7 is obtained.

However, as shown in FIG. 8, arithmetic device allocation for separately allocating the two multiplications 61 and 62 of FIG. 6 to different multipliers 101 and 102 is also possible. The circuit of FIG. 8 includes: a multiplier 101 for multiplying inputs a and b together; a multiplier 102 for multiplying inputs b and c together; a register (R1) 103 for storing and retaining a multiplication result of the multiplier 101; an adder for adding an output of the register 103 and a multiplication result of the multiplier 102 together so as to output an operation result x; and a controller for generating a signal to control the register 103.

The circuit of FIG. 8 requires two multipliers, but a selector, which is required in the arithmetic device allocation result shown in FIG. 7, is not required. Therefore, in the case where an area of a multiplier is smaller than that of a selector, the arithmetic device allocation result shown in FIG. 8 allows the entire circuit area to be small as compared to the arithmetic device allocation result shown in FIG. 7. On the other hand, in the case where the area of the selector is smaller than that of the multiplier, the arithmetic device allocation result shown in FIG. 7 allows the entire circuit area to be small as compared to the arithmetic device allocation result shown in FIG. 8.

In general, a multiplier has an area larger than that of a selector, and therefore in many cases, the arithmetic device allocation result shown in FIG. 7 is preferable. However, in the case of an arithmetic operation for which an arithmetic device having an area smaller than that of the selector is used, as in the case of FIG. 8, an arithmetic device allocation result in which an arithmetic device is not shared between arithmetic operations allows the entire circuit area to be small as compared to the arithmetic device allocation result shown in FIG. 7.

Now, a case where arithmetic device allocation is performed based on the scheduling and register allocation results shown in FIG. 9 is examined. In FIG. 9, inputs a and b are added together (addition 111) in cycle 1, inputs c and d are added together (addition 112) in the next cycle 2, and the results of the additions 111 and 112 are multiplied together. In FIG. 9, data (the addition result of inputs a and b) represented by the branch crossing the border of the clock cycle is stored in the register R1.

In this case, arithmetic device allocations shown in FIGS. 10 and 11 are possible. The circuit shown in FIG. 10 includes: a selector for selecting either inputs a or c; a selector for selecting either inputs b or d; an adder for adding the selection results of both selectors together; a register for storing and retaining the addition result of the adder; a multiplier for multiplying an output of the register and the addition result of the adder together so as to output a multiplication result x; and a controller for generating signals to respectively control the register and the selectors.

The circuit shown in FIG. 11 includes: an adder for adding inputs a and b together; a register for storing and retaining the addition result (a+b); an adder for adding inputs c and d together; a multiplier for multiplying the addition result (c+d) and an output of the register together so as to output a multiplication result x; and a controller for generating a signal to control the register.

The circuit of FIG. 10 realizes the additions 111 and 112 using a single adder, but two selectors are required. On the other hand, the circuit of FIG. 11 requires realizes the additions 111 and 112 using two adders, but no selector is required. Therefore, when the total area of two selectors is smaller than the area of an adder, the arithmetic device allocation result shown in FIG. 10 in which the additions 111 and 112 are realized by the single adder allows the entire circuit area to be small as compared to the arithmetic device allocation result shown in FIG. 11. On the contrary, when the total area of two selectors is larger than the area of an adder, the arithmetic device allocation result shown in FIG. 11 in which the additions 111 and 112 are realized by the two adders allows the entire circuit area to be small as compared to the arithmetic device allocation result shown in FIG. 10.

In general, an area of an adder is about twice as large as that of a selector having the same bit width as that of the adder, and therefore by using a selector so as to share an adder between additions, rather than separately allocating the additions to adders, the entire circuit area is made small. On the other hand, in the case where an arithmetic device (an adder, a multiplier, or the like) is smaller than a selector, by separately allocating arithmetic operations to arithmetic devices, the entire circuit are a is naturally made small. However, there are some cases where the entire circuit area is made small by using a separate adder for each addition so as to reduce the number of selectors, rather than sharing an adder between additions.

However, in the conventional arithmetic device allocation design method for minimizing the number of arithmetic devices, as shown in FIGS. 7 and 10, the number of arithmetic devices is minimum, but more selectors are required, and therefore the entire circuit area may be increased rather than being reduced.

Next, a case where the arithmetic device allocation is performed based on the scheduling result shown in FIG. 12 is examined. In FIG. 12, inputs a and b are added together (addition 141) in cycle 1, and the addition result and input c are multiplied together (multiplication 142), so that an arithmetic operation result x is output. In the next cycle 2, inputs c and d are multiplied together (multiplication 143), and the multiplication result and input b are added together (addition 144), so that an arithmetic operation result y is output.

In the case of using the conventional arithmetic device allocation design method for minimizing the number of arithmetic devices, the circuit shown in FIG. 13 is obtained. The circuit of FIG. 13 includes selectors 154 and 155, an adder 152, a multiplier 153 and a controller 151. The additions 141 and 144 are allocated to a single adder 152, and the multiplications 142 and 143 are allocated to a single multiplier 153.

The operation of the circuit shown in FIG. 13 is now described. In cycle 1, control signals 157 and 158 output by the controller 151 respectively correspond to 1 and 0. Therefore, the selector 154 selects input a so as to be input to the adder 152. The adder 152 calculates an addition (a+b) so as to output the addition result to the selector 155. The selector 155 selects the result of the addition (a+b) so as to be input to the multiplier 153. The multiplier 153 calculates a multiplication ((a+b)×c) so as to output a multiplication result x. In cycle 2, the control signals 157 and 158 output by the controller 151 respectively correspond to 0 and 1. Therefore, the selector 155 selects input d so as to be input to the multiplier 153. The multiplier 153 calculates a multiplication (d×c) so as to output the multiplication result to the selector 154. The selector 154 selects the result of the multiplication (d×c) so as to be input to the adder 152. The adder 152 calculates an addition ((d×c)+b) so as to output an addition result y. In this manner, the circuit of FIG. 13 can obtain the operation of the arithmetic operation results x and y shown in FIG. 12 using a single adder and a single multiplier.

However, in the circuit of FIG. 13, as indicated by the bold line, a loop 156 including only a combination circuit is created. The combination circuit refers to a logic circuit in which a logic output thereof is determined by each logic input, and examples of the combination circuit include inverters, NAND circuits, NOR circuits or the like, and a combination thereof. A sequential circuit, such as a flip flop or a latch circuit, is not included in the combination circuit. Ideally, the control signals 157 and 158 output by the controller 151 do not correspond to 0 simultaneously, and therefore the selectors 154 and 155 do not select a left-side input simultaneously, whereby the loop 156 is unlikely to be activated. However, in an actual circuit, timings at which the control signals 157 and 158 output by the controller 151 vary can differ from each other, and therefore the loop 156 is activated only for a short period of time.

In the loop 156 including only the combination circuit as described above, data returns to the same arithmetic devices, and therefore there is a possibility that oscillation might be caused based on a principle similar to a ring oscillator. Once the oscillation is caused, power consumption is increased and moreover, circuit operation becomes unstable, thereby causing circuit malfunction. Furthermore, the presence of such a loop prevents correct evaluation of delays in the steps of logic synthesis, floor planning (layout by units of blocks), routing of layout (layout by units of a gate in a block), etc. Therefore, the circuit created by the arithmetic device allocation design method for minimizing the number of arithmetic devices is unreliable.

Next, a case where the arithmetic device allocation is performed based on the scheduling result shown in FIG. 14 is examined. In cycle 1 of FIG. 14, inputs a and b are multiplied together, and the multiplication result and input c are added together (addition 161) so that an arithmetic operation result x is output. In the next cycle 2, inputs c and d are added together (addition 162) and the addition result is divided by input e so that an arithmetic operation result y is output.

Here, the delay for an operation of an adder is 5 ns, the delay for an operation of each of a multiplier and a divider is 60 ns, the delay for an operation of a selector is 1 ns, and a clock period is 100 ns. In cycle 1 of FIG. 14, the multiplication and the addition are successively performed, and therefore a period of 65 ns is required. However, the clock period is 100 ns, and therefore there is a sufficient amount of time to complete these arithmetic operations. Also, in cycle 2, there is a sufficient amount of time to complete arithmetic operations.

In the case where the arithmetic device allocation is performed based on the scheduling result shown in FIG. 14 using the conventional arithmetic device allocation method for minimizing the number of arithmetic devices, the circuit shown in FIG. 15 can be obtained. The circuit of FIG. 15 includes: a multiplier 171; a selector 174; an adder 172; a divider 173; and a controller 175, and two additions 161 and 162 (FIG. 14) are allocated to a single adder 172.

The operation of the circuit shown in FIG. 15 is now described. In cycle 1, a control signal 177 output by the controller 175 corresponds to 0. Therefore, the selector 174 selects an output (a×b) of the multiplier 171 so as to be input to the adder 172. The adder 172 adds the output (a×b) and input c together so as to output an arithmetic operation result x. In this case, if each of the delays in the paths from inputs a, b and c to the arithmetic operation result x is equal to or less than the clock period of 100 ns, the arithmetic operation result x is correctly output. The path from input a to the arithmetic operation result x extends through the multiplier 171, the selector 174 and the adder 172, and therefore the delay in that path is 66 ns. Further, the respective delays in the paths from inputs b and c to x are 66 ns and 5 ns, and therefore each of the delays in all the paths is equal to or less than the clock period. In cycle 2, the control signal 177 output by the controller 175 corresponds to 1. Therefore, the adder 172 receives input d and calculates an addition (d+c) so as to output the addition result to the divider 173. The divider 173 calculates a division (d+c)/e so as to output an arithmetic operation result y. In this case, if each of the delays in the paths from inputs c, d and e to the arithmetic operation result y is equal to or less than the clock period of 100 ns, the arithmetic operation result y is correctly output. The path from input d to the arithmetic operation result y extends through the selector 174, the adder 172 and the divider 173, and therefore the delay in that path is 66 ns. Further, the respective delays in the paths from inputs c and e to the arithmetic operation result y are 65 ns and 60 ns, and therefore each of the delays in all the paths is equal to or less than the clock period.

In the circuit of FIG. 15, there is a path 176 from input a to the arithmetic operation result y indicated by the bold line. The path 176 extends through the multiplier 171, the selector 174, the adder 172 and the divider 173, and therefore the sum of the delays is 126 ns. If data flows through the path 176, a delay in the entire circuit becomes greater than the clock period of 100 ns, and therefore circuit malfunction is caused. However, when the control signal 177 output by the controller 175 corresponds to 0, the selector 174 selects data so as to flow through the path from input a to the arithmetic operation result x, and when the control signal 177 corresponds to 1, the selector 174 selects data so as to flow through the path from input d to the arithmetic operation result y, and therefore data does not flow through the path from input a to the arithmetic operation result y. Thus, even if the sum of the delays along the path 176 from input a to the arithmetic operation result y exceeds the clock period, the circuit functions normally, and therefore there is no need to consider the path 176 from input a to the arithmetic operation result y. A path such as the path 176 is referred to as a "false path".

However, it is not possible to distinguish whether a path is a false path or a path through which data actually flows using an automatic logic synthesis tool, a floor planning tool, a layout routing tool, or the like which are presently available. Therefore, a pseudo-timing error is caused because of the generation of a false path longer than a clock period, or an arithmetic device on the false path is replaced by an arithmetic device, which is fast but has a large area, at the time of the optimization in a logic synthesis step, so that a circuit area is increased for no reason. If any tool capable of recognizing the false path is realized in the future, such problems would not be caused, but these problems are frequently caused at present.

As a method for detecting a timing error due to a false path as described above, there is a method disclosed in Japanese Laid-Open Patent Publication No. 2000-203555, for example. However, this method detects a false path by performing a simulation so as to confirm that a timing error does not happen in reality, and therefore there is a problem that the detection of the false path requires a very long period of time. Further, when there is any omission in simulation patterns, there is a possibility that a path through which a signal is actually transferred is mistakenly recognized as being a false path.

Furthermore, in order to omit a loop including only a combination circuit, a long false path, or the like, after the arithmetic device allocation is performed without considering the generation of the loop including only a combination circuit, the long false path, and the like, it is necessary to add an arithmetic device to a circuit such that a single arithmetic device is not shared between a plurality of arithmetic devices, thereby increasing a circuit area.

SUMMARY OF THE INVENTION

According to one aspect of the present invention, there is provided an arithmetic device allocation design method for allocating arithmetic operations in a data flow graph, which includes a branch and a node respectively representing a flow of data and an arithmetic operation, to an arithmetic device based on a scheduling result when performing high-level synthesis for synthesizing a circuit from behavioral descriptions which do not include information about hardware structures and only include a processing algorithm, and the method includes the steps of: in the case of allocating an arithmetic operation A to the arithmetic device, comparing an increased circuit area due to a selector to be provided so as to allocate the arithmetic operation A to an arithmetic device C to which another arithmetic operation B has already been allocated and an increased area due to an arithmetic device D to be created anew to which only the arithmetic operation A is allocated; when the increased circuit area due to the selector is smaller, allocating the arithmetic operation A to the arithmetic device C to which the another arithmetic operation B has already been allocated while providing the selector; and when the increased circuit area due to the arithmetic device D is smaller, creating the arithmetic device D anew so as to allocate the arithmetic operation A to the arithmetic device D created anew.

In the case of designing an LSI circuit, a chip size is made to be as small as possible. Further, in order to realize fast arithmetic operations, by sharing all the arithmetic devices and registers, which are available for sharing, between corresponding arithmetic operations, arithmetic device and register allocations can be performed so as to minimize the number of arithmetic devices and registers, and scheduling can be performed so as to allocate as many arithmetic devices as possible in one clock period.

In the present invention, attentions are focused on an undesirable increase in circuit area for performing some arithmetic operations. Comparison between a method A which increases an area (an area of an arithmetic device) by allocating an arithmetic operation to an arithmetic device created anew and a method B which increases an area (an area of a selector) by allocating an arithmetic operation to an arithmetic device to which another arithmetic operation has already been allocated, such that the same type of arithmetic operations are not separately allocated to arithmetic devices created anew so as to reduce the number of arithmetic devices (in this case, a selector is often required), is made. Then, in order to make the circuit area as small as possible, an allocation operation is actually performed according to one of methods A and B which results in a smaller increase in area.

According to the method described above, as shown with respect to Embodiment 1 of the present invention described below, it is possible to obtain an arithmetic device allocation result which results in the total area of an arithmetic device and a selector which is small, so as not to cause an increase in the entire area of a circuit due to employment of a small number of arithmetic devices and a large number of selectors or employment of a large number of arithmetic devices for reducing the number of selectors.

According to another aspect of the present invention, there is provided an arithmetic device allocation design method for allocating arithmetic operations in a data flow graph, which includes a branch and a node respectively representing a flow of data and an arithmetic operation, to an arithmetic device based on a scheduling result when performing high-level synthesis for synthesizing a circuit from behavioral descriptions which do not include information about hardware structures and only include only processing algorithm, and the method includes the steps of: in the case of allocating a plurality of arithmetic operations to a single arithmetic device, determining whether or not a loop extending through only a combination circuit is generated; when a loop extending through only a combination circuit is not generated, allocating the plurality of arithmetic operations to the arithmetic device; and when a loop extending through only a combination circuit is generated, separately allocating the plurality of arithmetic operations to different arithmetic devices.

According to the method described above, as shown with respect to Embodiment 2 of the present invention described below, it is possible to obtain an arithmetic device allocation result so as to prevent the generation of a loop extending through only a combination circuit, and therefore it is possible to prevent an increase in power consumption due to oscillation of the circuit and/or circuit malfunction. Further, it is possible to precisely estimate the delays in the steps of logic synthesis, floor planning, routing of layout, etc. The presence of the loop can be detected by determining whether or not the same arithmetic operation as a focused arithmetic operation is present as a pre- or post-arithmetic operation. When the same arithmetic operation as the focused arithmetic operation is present, the loop is determined to be present.

According to still another aspect of the present invention, there is provided an arithmetic device allocation design method for allocating arithmetic operations in a data flow graph, which includes a branch and a node respectively representing a flow of data and an arithmetic operation, to an arithmetic device based on a scheduling result when performing high-level synthesis for synthesizing a circuit from behavioral descriptions which do not include information about hardware structures and only include only processing algorithm, and the method includes the steps of: in the case of allocating a plurality of arithmetic operations to a single arithmetic device, determining whether or not a false path longer than a designated period of time is generated; when a false path longer than a designated period of time is not generated, allocating the plurality of arithmetic operations to the arithmetic device; and when a false path longer than a designated period of time is generated, separately allocating the plurality of arithmetic operations to different arithmetic devices.

A false path is a path on which no operation can be actually performed in terms of the operation of the LSI circuit, and therefore no problems are caused in the actual LSI circuit itself if a false circuit is present in the circuit. However, in the case of performing a circuit verification process using a conventional design verification tool and a circuit logic optimization process using a conventional logic synthesis tool after the design of the LSI circuit is completed, the conventional design verification tool and the conventional logic synthesis tool cannot recognize a false path, and therefore problems are caused.

In general, the design verification tool recognizes the delay greater than a clock period as an error. Further, the conventional logic synthesis tool mistakenly recognizes a false path as a path on which any operation is actually performed, and thus the false path is optimized. In this case, the circuit is required to be designed such that each operation performed in the paths which are present between one register and another register is completed within a delay of a clock period, and therefore when the delay caused by the presence of the false path is greater than a clock period, the optimization operation is performed by replacing an arithmetic device(s) on the false path with a faster arithmetic device(s) such that the delay caused by the false path is within one clock period. In general, a fast arithmetic device has a large area, and therefore the circuit area is increased. Further, no operation is actually performed on the false path, and therefore such an optimization operation is unnecessary and the circuit area is increased for no reason.

Therefore, in the present invention, in order that no error is caused even in the case of using such conventional design verification and logic synthesis tools, a clock period±α is set as a designated value. When a false path temporally longer than this designated value is present, the circuit design is performed again so as to reperform arithmetic device allocation. When a false path temporally shorter than a clock period±α is present, originally performed arithmetic device allocation is employed. The reason for this is that the false path is a path on which no operation is actually performed, and therefore no problems are caused in the LSI circuit. Further, in this case, no error is caused even in the case of using the design verification tool, and therefore no problems are caused in terms of circuit operations.

According to the method described above, as shown with respect to Embodiment 3 of the present invention described below, it is possible to obtain an arithmetic device allocation result which does not generate a false path equal to or longer than a designated period, and therefore it is possible to prevent the generation of a pseudo-timing error caused to a false path longer than a clock period and/or a circuit area from being increased for no reason due to the replacement of an arithmetic device on a false path by another arithmetic device, which is fast but has a large area, at the time of the optimization in a logic synthesis step.

In one embodiment of the present invention, the arithmetic operation allocation is sequentially performed from an arithmetic operation using an arithmetic device having a large area.

In the case where the arithmetic operation allocation is sequentially performed from an arithmetic operation using an arithmetic device having a small area, an arithmetic device having a large area has to be used at the end of the arithmetic operation allocation, thereby increasing the total circuit area. However, according to the method described above, as shown with respect to Embodiment 4 described below, it is possible to minimize an increase in a circuit area in the cases where an arithmetic device is added so as to reduce the number of selectors, prevent the generation of the loop including only a combination circuit, prevent the generation of a false path equal to or more than a designated period, or the like.

Thus, the invention described herein makes possible the advantages of providing an arithmetic device allocation design method capable of reducing circuit scale so as not to include a loop including only a combination circuit and a long false path in the circuit.

These and other advantages of the present invention will become apparent to those skilled in the art upon reading and understanding the following detailed description with reference to the accompanying figures.

BRIEF DESCRIPTION OF THE DRAWINGS

FIG. 1 is a flowchart for explaining high-level synthesis technologies.

FIG. 2 is a diagram illustrating an example of behavioral descriptions.

FIG. 3 is a diagram illustrating a data flow graph (DFG) of the behavioral descriptions of FIG. 2.

DESCRIPTION OF THE PREFERRED EMBODIMENTS

Hereinafter, embodiments of the present invention will be described with reference to the drawings.

(Embodiment 1)

Figure 16:
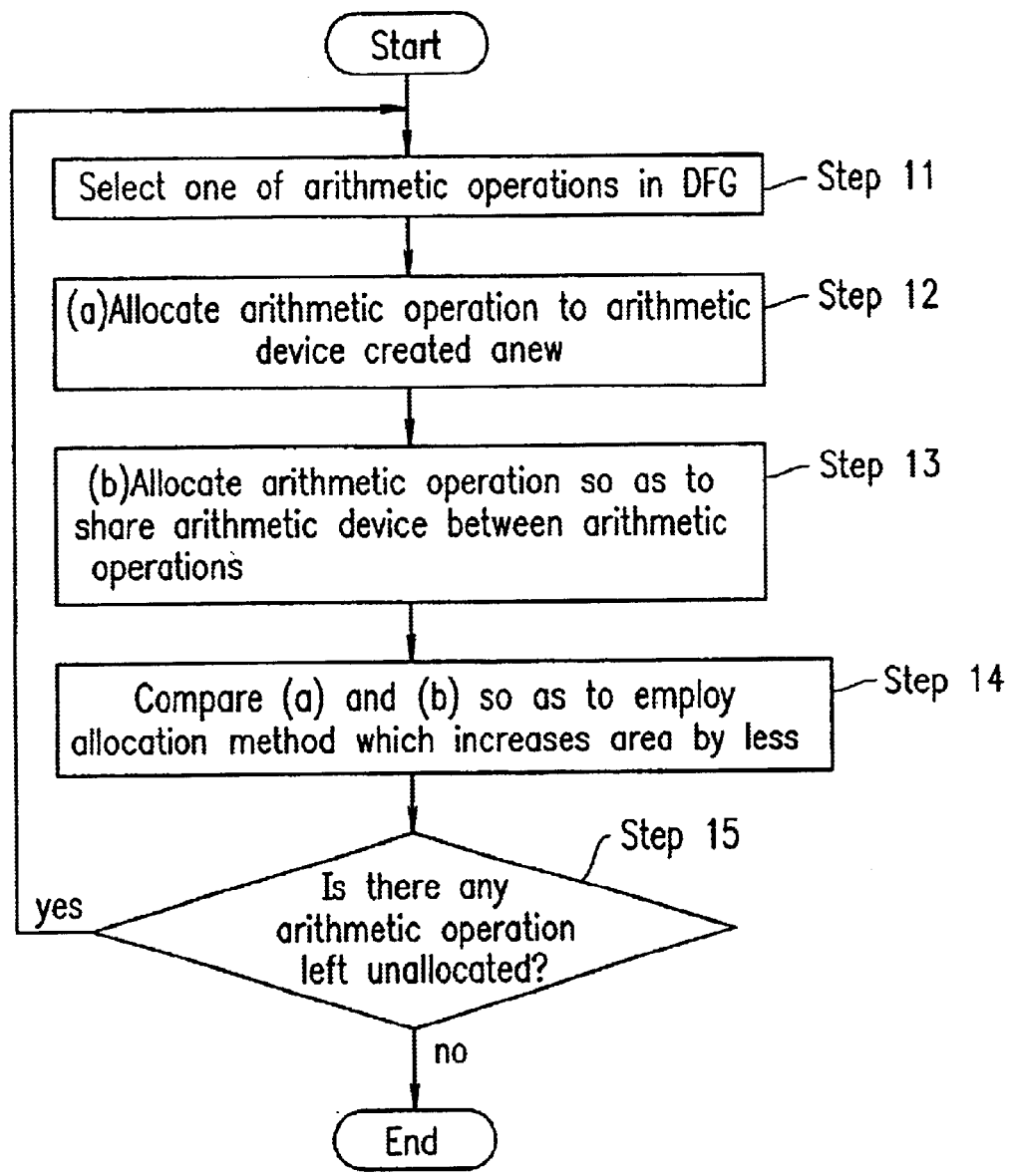
FIG. 16 is a diagram for explaining a procedure of an arithmetic device allocation design method according to Embodiment 1 of the present invention.

FIG. 16 is a flowchart for explaining an arithmetic device allocation design method according to Embodiment 1 of the present invention. In Embodiment 1, arithmetic operations in a data flow graph (DFG) are allocated to corresponding arithmetic devices one by one based on a scheduling result.

At step 11, one of the arithmetic operations in the DFG is selected. The following two methods (a) and (b) are respectively attempted at steps 12 and 13: (a) the arithmetic operation selected at step 11 is allocated to an arithmetic device created anew; and (b) an arithmetic operation is allocated to an arithmetic device to which another arithmetic operation has already been allocated so as to share the arithmetic device between these arithmetic operations. In such a case of allocating an arithmetic operation to an arithmetic device to which another operation has already been allocated so as to share the arithmetic device between these arithmetic operations, a selector is provided so as to prevent the arithmetic operations from interfering with each other. Further, in the case where there are a plurality of arithmetic devices on which an allocation operation can be performed according to the method (b), the allocation operation is attempted with respect to each of the plurality of arithmetic devices.

Next, at step 14, comparison between an increased area of the arithmetic device created anew when the arithmetic operation is allocated to the arithmetic device according to the method (a) and an increased area of the selector provided when the arithmetic operation is allocated to the arithmetic device according to the method (b) is made, and an allocation method which increases the area by less is employed. In this case, when there are a plurality of arithmetic devices on which the allocation operation can be performed according to the method (b), an allocation operation resulting in the smallest circuit area is employed as the method (b). At step 15, it is determined whether or not there is an arithmetic operation(s) left unallocated. If there is an arithmetic operation(s) left unallocated, the process returns to step 11, and when there is no arithmetic operation left unallocated, the process is ended.

The arithmetic device allocation design method according to Embodiment 1 is described in detail below in conjunction with a case where the arithmetic operations in the DFG are allocated to the arithmetic devices based on the scheduling and register allocation results shown in FIG. 17. In this case, areas of an adder and a selector are respectively represented by 9 and 5.

Figure 17:
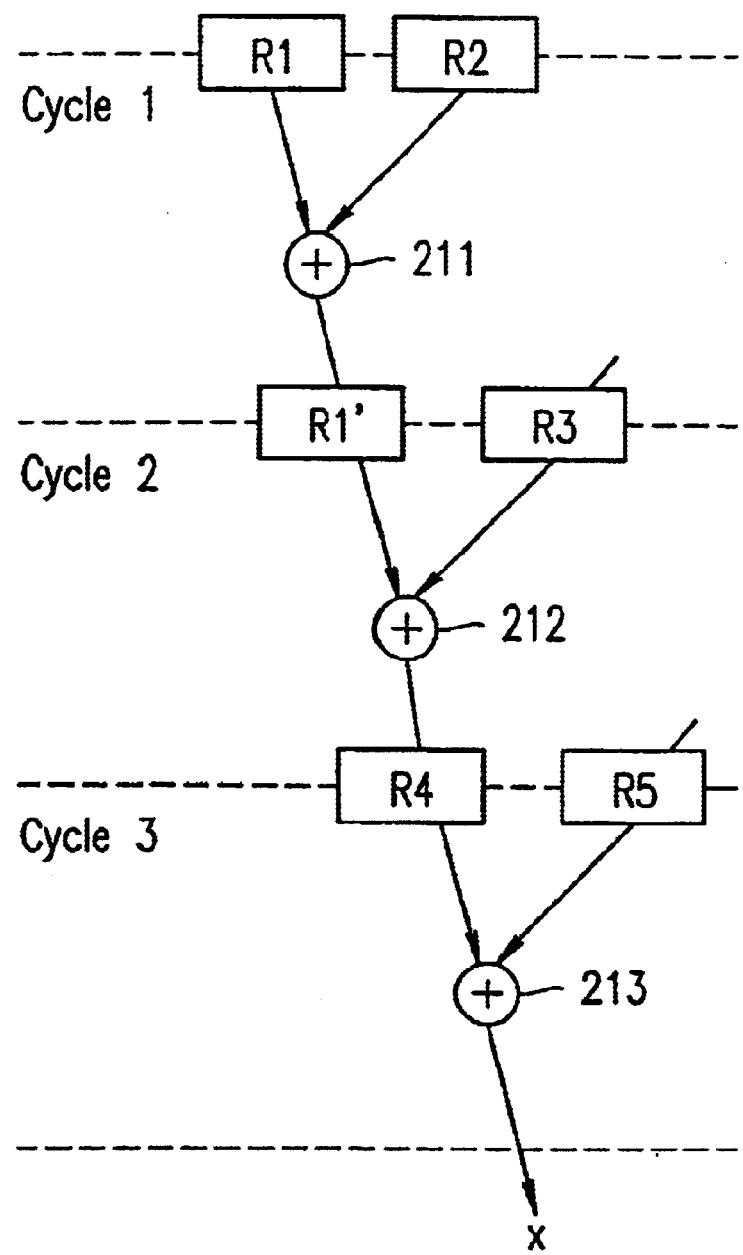
FIG. 17 is a diagram illustrating an example of the scheduling result of the DFG according to the present invention.

In FIG. 17, data retained in a register R1 and data retained in a register R2 are added together (addition 211) in cycle 1 so that the addition result is stored in a register R1'. In the next cycle 2, the data stored in the register R1' and data retained in a register R3 are added together (addition 212) so that the addition result is stored in a register R4. Then, in cycle 3, the data stored in the register R4 and data retained in a register R5 are added together (addition 213) so that an arithmetic operation result x is output.

Figure 18:
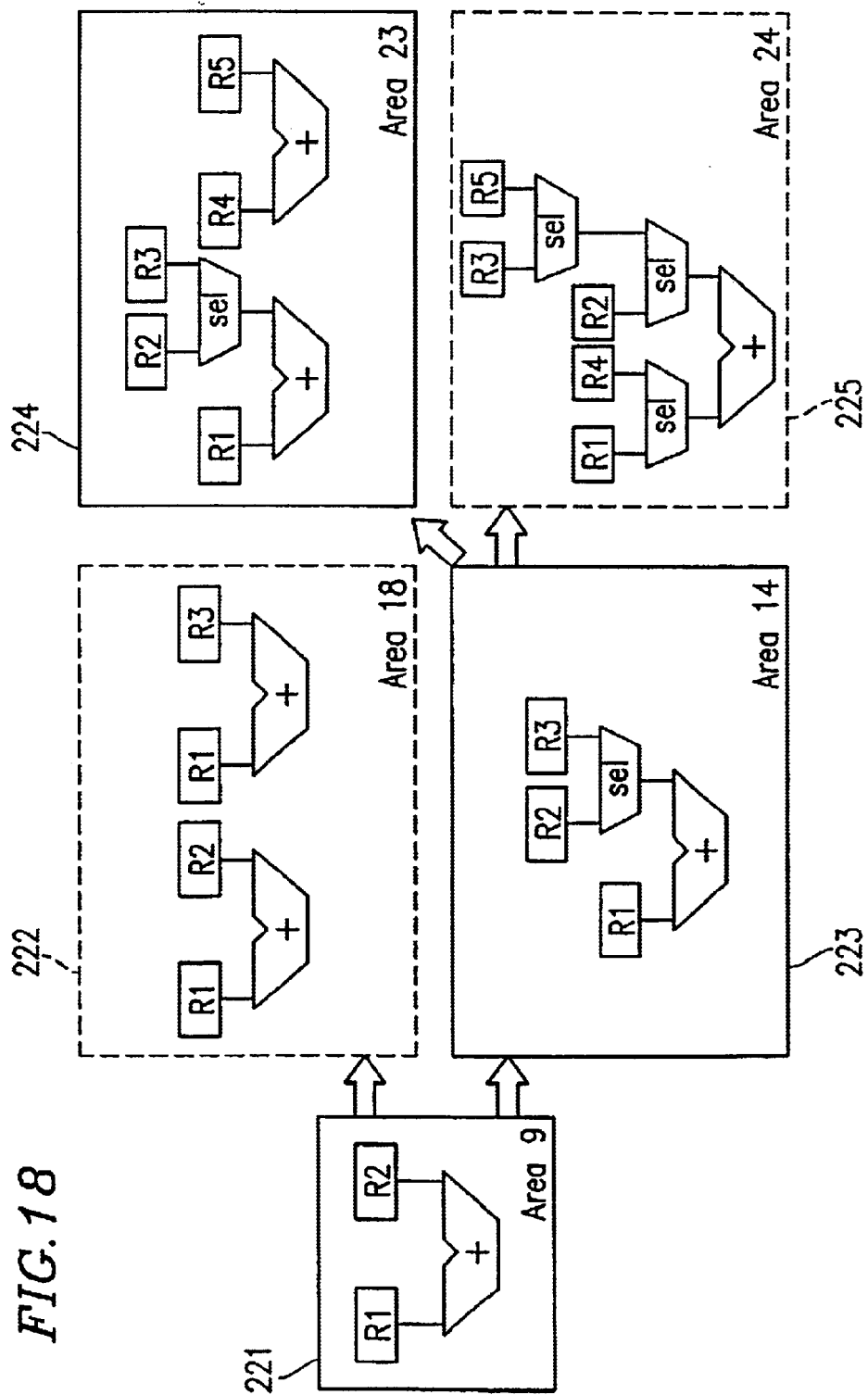
FIG. 18 is a diagram for explaining another procedure of an arithmetic device allocation design method according to Embodiment 1 of the present invention.

The addition 211 is allocated to an arithmetic device created anew based on the scheduling and register allocation results shown in FIG. 17 according to the method (a), so that an allocation result denoted by reference numeral 221 in FIG. 18 is obtained. At this point, a circuit area is 9 which corresponds to one adder. There is no arithmetic device to which another arithmetic operation has already been allocated, and therefore the method (b) for sharing an arithmetic device with another arithmetic operation is not performed.

Next, the addition 212 is allocated to an arithmetic device created anew according to the method (a) so that an allocation result denoted by reference numeral 222 in FIG. 18 is obtained. In this case, a circuit area is 18 which corresponds to two adders.

At this point, the arithmetic device to which the arithmetic operation 211 has already been allocated is present, and therefore the addition 212 is allocated to that arithmetic device according to the method (b) for sharing an arithmetic device with another arithmetic operation so that an allocation result denoted by reference numeral 223 in FIG. 18 is obtained. In this case, a circuit area is 14 which corresponds to one adder and one selector.

Here, comparison between area 18 of the allocation result 222 according to the method (a) and area 14 of the allocation result 223 according to the method (b) is made, so that the method (b) resulting in a smaller area (allocation result 223) is employed. In the case where there are a plurality of arithmetic devices each including another arithmetic operation allocated thereto, an allocation operation is attempted with respect to each of the plurality of arithmetic devices so as to employ an allocation operation resulting in a smallest circuit area.

Next, the addition 213 is allocated to an arithmetic device created a new according to the method (a) so that an allocation result denoted by reference numeral 224 in FIG. 18 is obtained. In this case, a circuit area is 23 which corresponds to two adders and one selector.

Further, the addition 213 is allocated to the arithmetic device of the allocation result 223 according to the method (b) for sharing an arithmetic device with another arithmetic operation so that an allocation result denoted by reference numeral 225 in FIG. 18 is obtained. In this case, a circuit area is 24 which corresponds to one adder and three selectors.

Here, comparison between area 23 of the allocation result 224 according to the method (a) and area 24 of the allocation result 225 according to the method (b) is made, so that the method (a) resulting in a smaller area (allocation result 224) is employed. In the case where there are a plurality of arithmetic devices each including another arithmetic operation allocated thereto, an allocation operation is attempted with respect to each of the plurality of arithmetic devices so as to employ an allocation operation resulting in a smallest circuit area.

Figure 19:
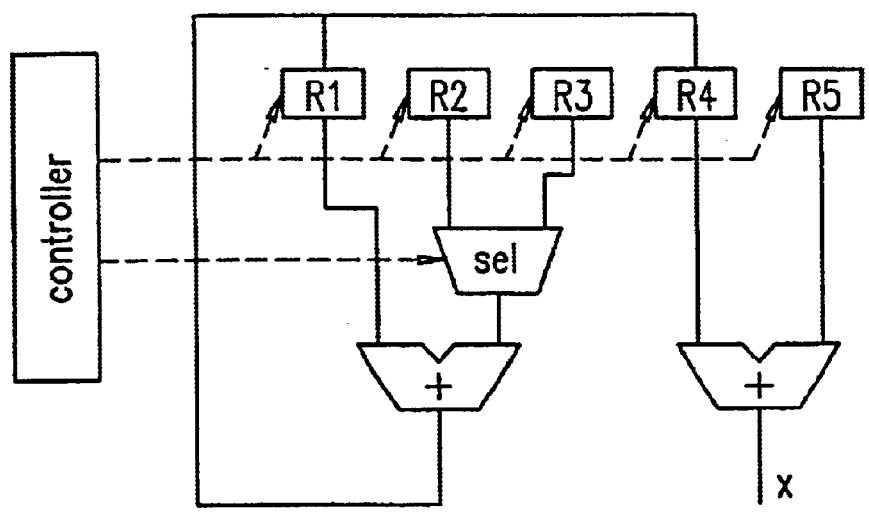
FIG. 19 is a diagram illustrating an example of a circuit obtained based on the scheduling result shown in FIG. 17.

The arithmetic device allocation described above results in the circuit shown in FIG. 19. The circuit of FIG. 19 includes: registers R1–R5; a selector for selecting one of outputs of the registers R2 and R3; an adder for adding outputs of the register R1 and the selector together so as to output the addition result to the registers R1 or R4; an adder for adding outputs of the registers R1 and R4 so as to output an operation result x; and a controller for generating signals to respectively control the registers R1–R5 and the selector.

Figure 20:
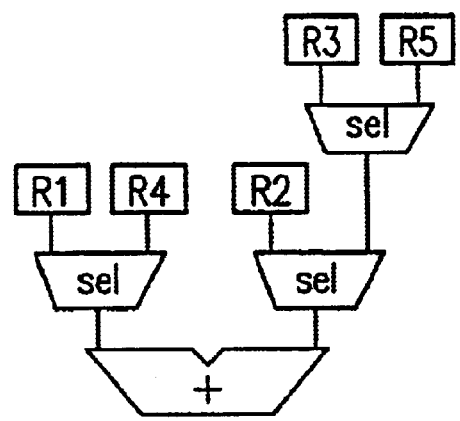
FIG. 20 is a diagram illustrating an example of an allocation result according to a conventional arithmetic device allocation design method.

On the other hand, a result of the arithmetic device allocation, which is performed on the arithmetic operations in the DFG based on the scheduling and register allocation results shown in FIG. 17 according to the conventional arithmetic device allocation design method for minimizing the number of arithmetic devices, is as shown in FIG. 20. In this case, the circuit shown in FIG. 21 is created.

In the conventional arithmetic device allocation result shown in FIG. 20, as in the case of the allocation result 225 in FIG. 18, the sum of areas of an adder and three selectors is 24, and therefore the area 23 of the arithmetic device allocation result according to Embodiment 1 is smaller.

Figure 21:
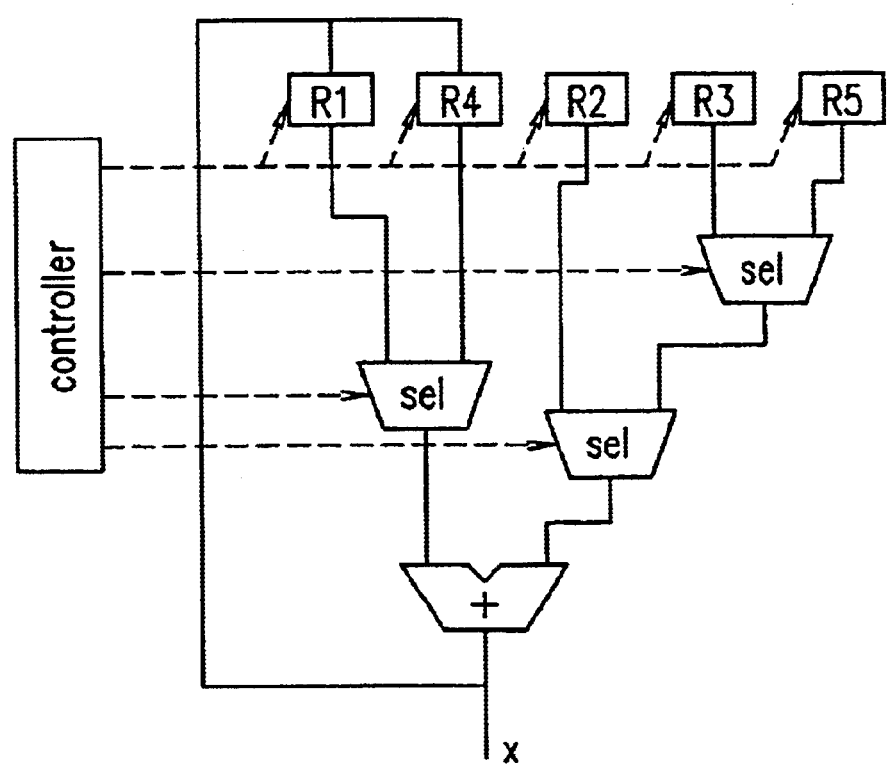
FIG. 21 is a diagram illustrating an example of a circuit obtained based on the scheduling result shown in FIG. 20.

The circuit shown in FIG. 21 includes: registers R1–R5; a (left-side) selector for selecting one of outputs of the registers R1 and R4; a (right-side) selector for selecting one of outputs of the registers R3 and R5; a (middle) selector for selecting one of outputs of the register R2 and the right-side selector; an adder for adding outputs of the left-side and middle selectors so as to input the addition result to the registers R1 or R4 or to output an operation result x; and a controller for generating signals to respectively control the registers R1–R5 and the selectors.

Figure 22:
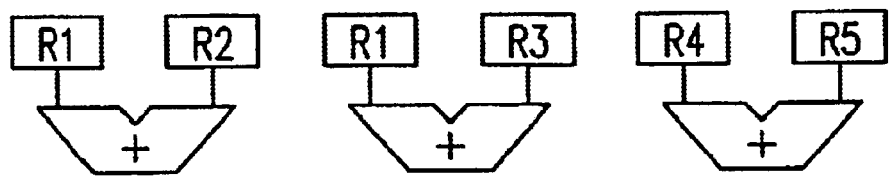
FIG. 22 is a diagram illustrating another example of an allocation result according to a conventional arithmetic device allocation design method.
Figure 23:
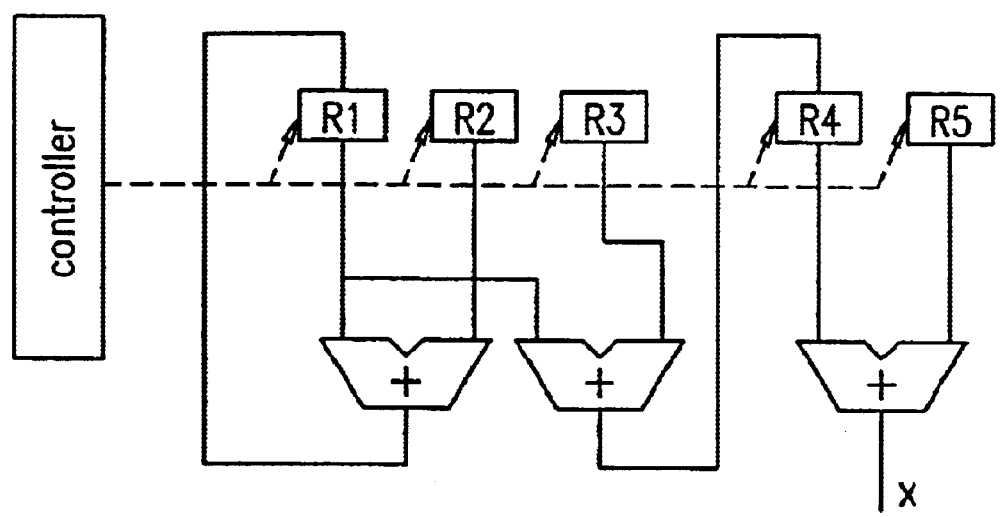
FIG. 23 is a diagram illustrating an example of a circuit obtained based on the scheduling result shown in FIG. 22.

FIG. 22 shows an arithmetic device allocation result in the case where arithmetic devices are not shared between any operations, and the circuit to be created in this case is as shown in FIG. 23.

The circuit of FIG. 23 includes: registers R1–R5, an adder for adding outputs of the registers R1 and R2 so as to output the addition result to the register R1; an adder for adding outputs of the registers R1 and R3 so as to output the addition result to the register R4; an adder for adding outputs of the registers R4 and R5 so as to output an operation result x; and a controller for generating signals to respectively control the registers R1–R5.

In the conventional arithmetic device allocation result shown in FIG. 22, a circuit area becomes 27 which corresponds to three adders. Therefore, the area 23 of the arithmetic device allocation result according to Embodiment 1 is smaller.

As described above, according to Embodiment 1, by comparing an increased area of an arithmetic device created anew and an increased area of a selector provided for sharing an arithmetic device between arithmetic operations so as to select an optimum arithmetic device allocation method, it is possible to obtain an arithmetic device allocation operation resulting in a small circuit area. Therefore, it is possible to perform arithmetic device allocation which can realize a highly-integrated LSI based on a scheduling result which improves a speed in an arithmetic operation.

(Embodiment 2)

Figure 13:
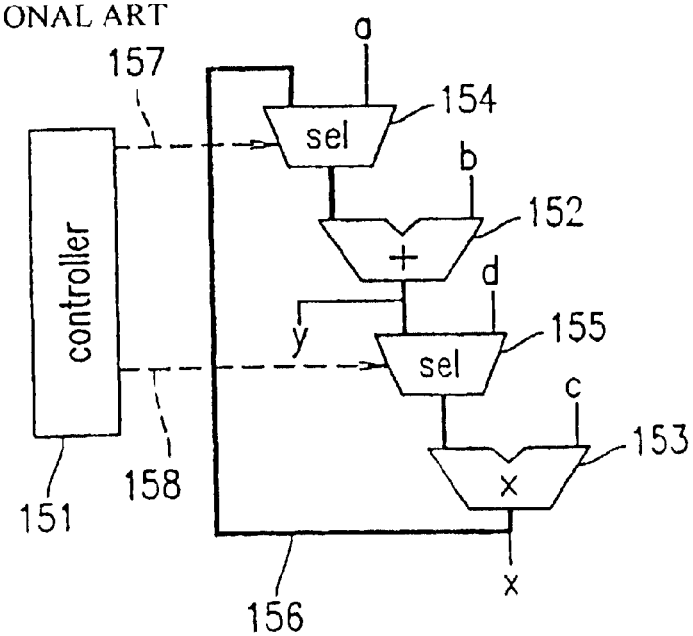
FIG. 13 is a diagram for explaining a loop including only a combination circuit.
Figure 14:
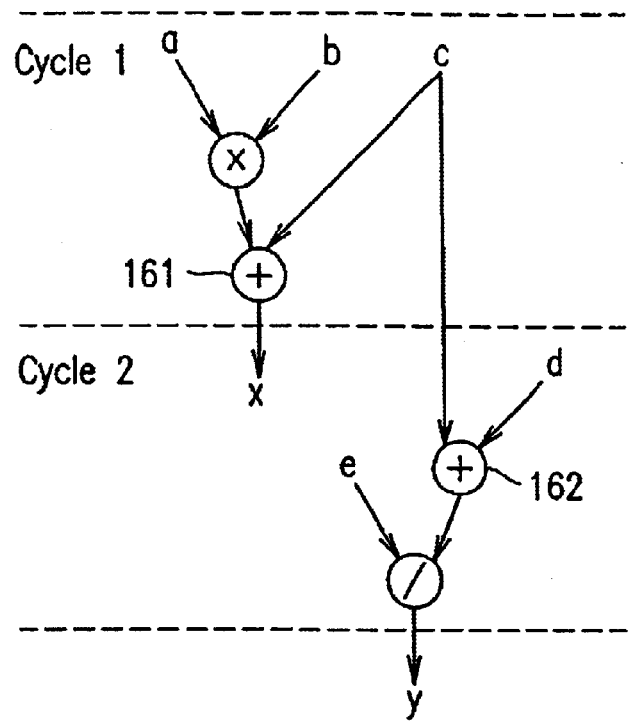
FIG. 14 is a diagram illustrating still another example of the scheduling result of the conventional DFG.
Figure 24:
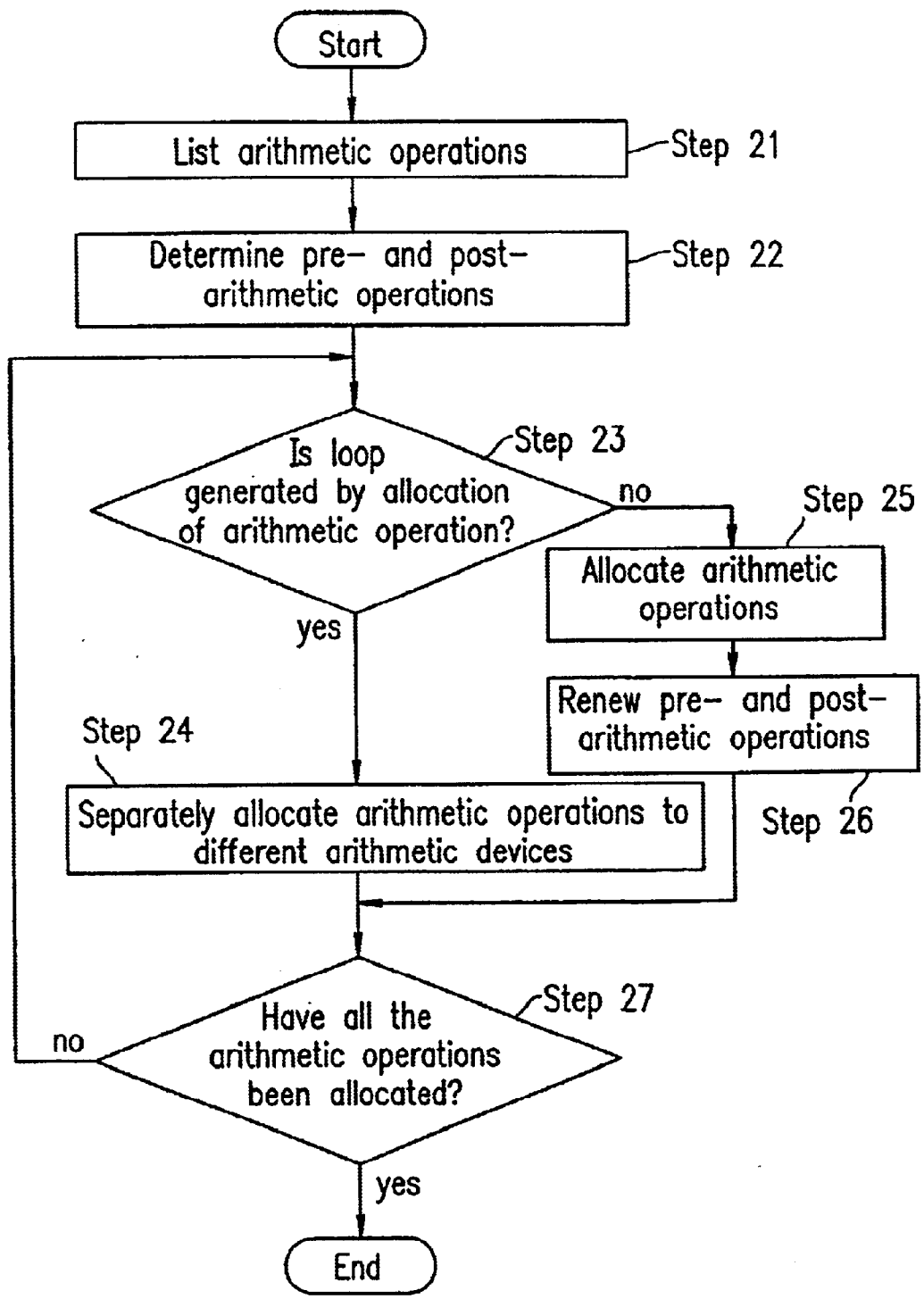
FIG. 24 is a diagram for explaining a procedure of an arithmetic device allocation design method according to Embodiment 2 of the present invention.

FIG. 24 is a flowchart for explaining an arithmetic device allocation design method according to Embodiment 2. Embodiment 2 prevents the loop including only a combination circuit as shown in FIG. 13 from being generated when an arithmetic operation in the DFG is allocated to an arithmetic device based on a scheduling result.

Figure 25:
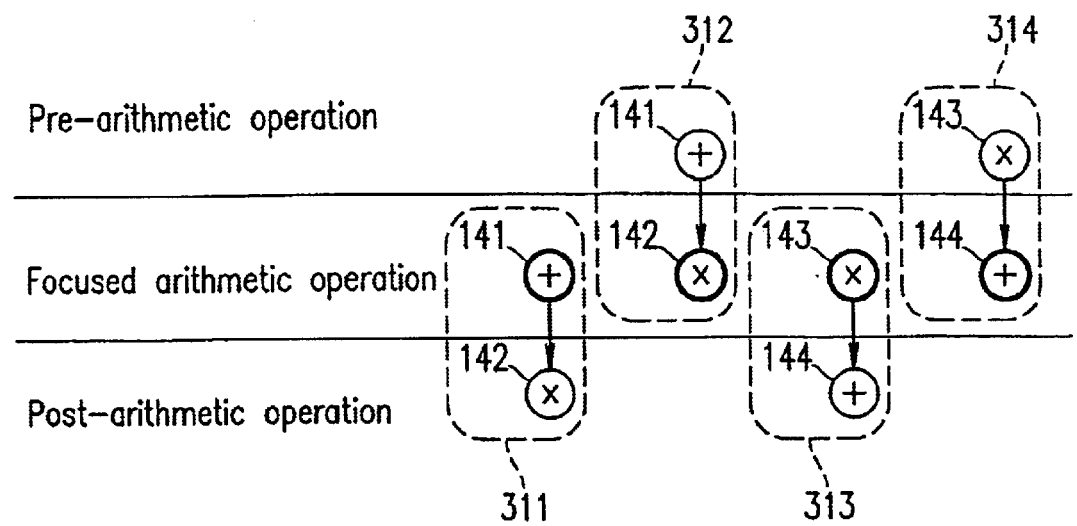
FIG. 25 is a diagram for explaining a focused arithmetic operation, a pre-arithmetic operation and a post-arithmetic operation.

Firstly, as a preparatory step, data dependency between arithmetic operations is examined according to a procedure as follows. At step 21, all the arithmetic operations to be allocated to arithmetic devices are detected from the DFG based on scheduling and register allocation results so as to be listed as focused arithmetic operations. Here, as shown in FIG. 25, each arithmetic device 141–144 is listed as a focused arithmetic operation based on, for example, the scheduling result of FIG. 12.

Next, at step 22, a pre-arithmetic operation or a post-arithmetic operation is determined with respect to each focused arithmetic operation. The pre-arithmetic operation refers to an arithmetic operation which is performed in the same clock cycle as its associated focused arithmetic operation and provides data to the associated focused arithmetic operation. As shown in FIG. 25, the pre-arithmetic operation of the focused arithmetic operation 142 is the arithmetic device 141 and the pre-arithmetic operation of the focused arithmetic operation 144 is the arithmetic device 143. The post-arithmetic operation refers to an arithmetic operation which is performed in the same clock cycle as its associated focused arithmetic operation and receives data from the associated focused arithmetic operation. As shown in FIG. 25, the post-arithmetic operation of the focused arithmetic operation 141 is the arithmetic device 142 and the post-arithmetic operation of the focused arithmetic operation 143 is the arithmetic device 144.

Figure 26:
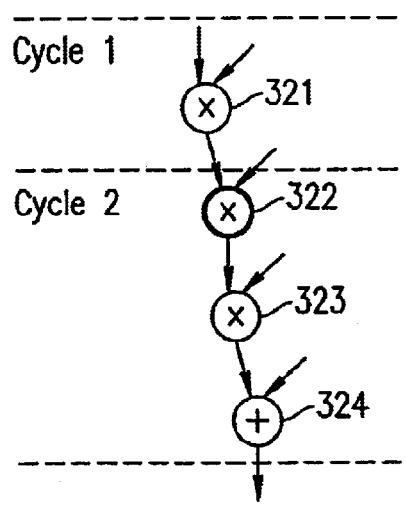
FIG. 26 is a diagram illustrating an example of the post-arithmetic operation.

It should be noted that another operation can be provided between a pre-or post-arithmetic operation and its associated focused arithmetic operation. For example, as shown in FIG. 26, in the case where a multiplication 321 is performed in cycle 1 and multiplications 322–324 are performed in cycle 2, when the multiplication 322 is determined as a focused arithmetic operation, not only the multiplication 323 but also the multiplication 324 are post-arithmetic operations. However, an arithmetic operation such as the operation 321 which is performed in a different cycle is not included in the pre- or post-arithmetic operations.

Figure 4:
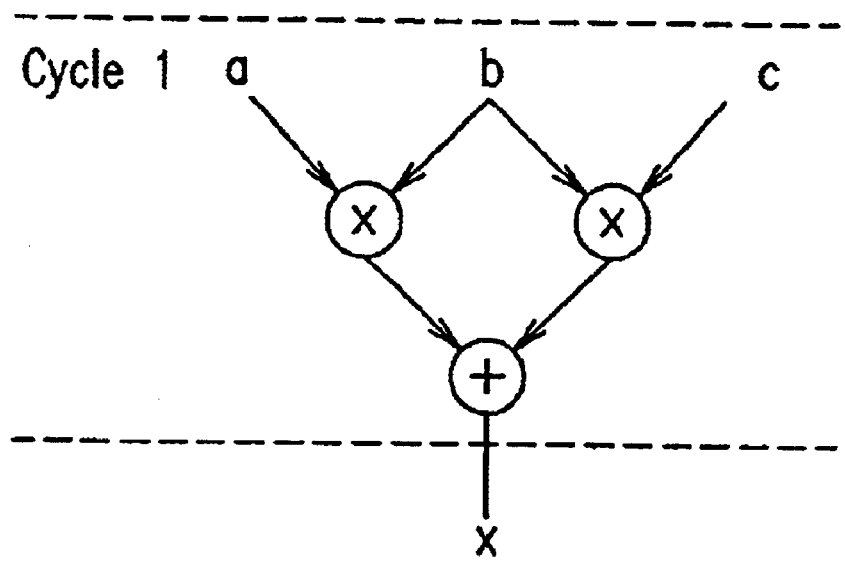
FIG. 4 is a diagram illustrating an example of a scheduling result of the DFG of FIG. 3.
Figure 5:
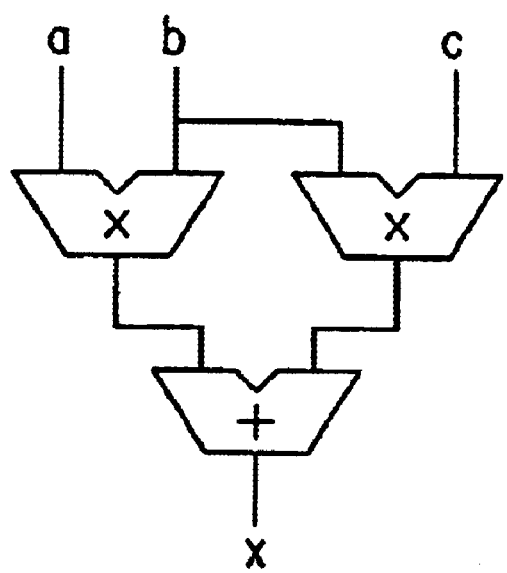
FIG. 5 is a diagram illustrating an example of a circuit obtained based on the scheduling result shown in FIG. 4.
Figure 6:
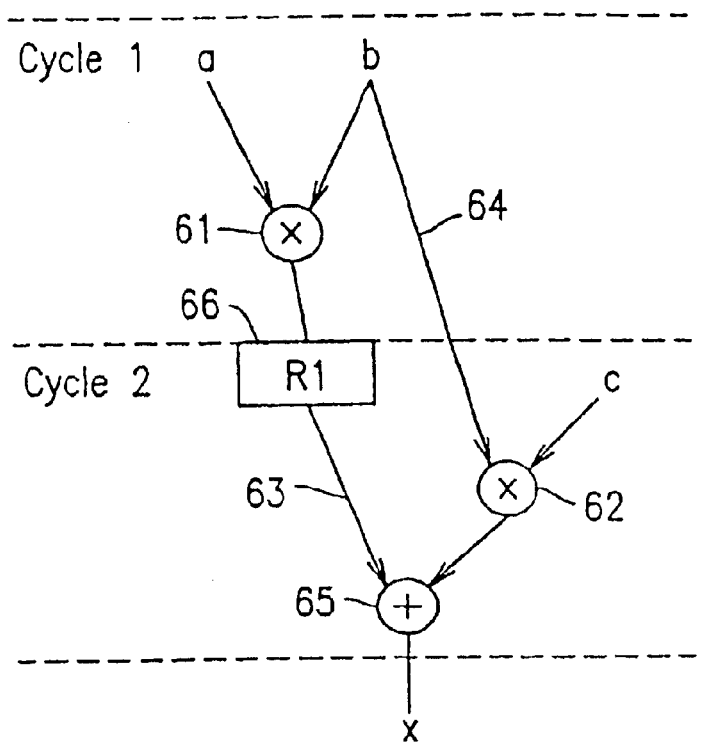
FIG. 6 is a diagram illustrating another example of the scheduling result of the DFG of FIG. 3.
Figure 7:
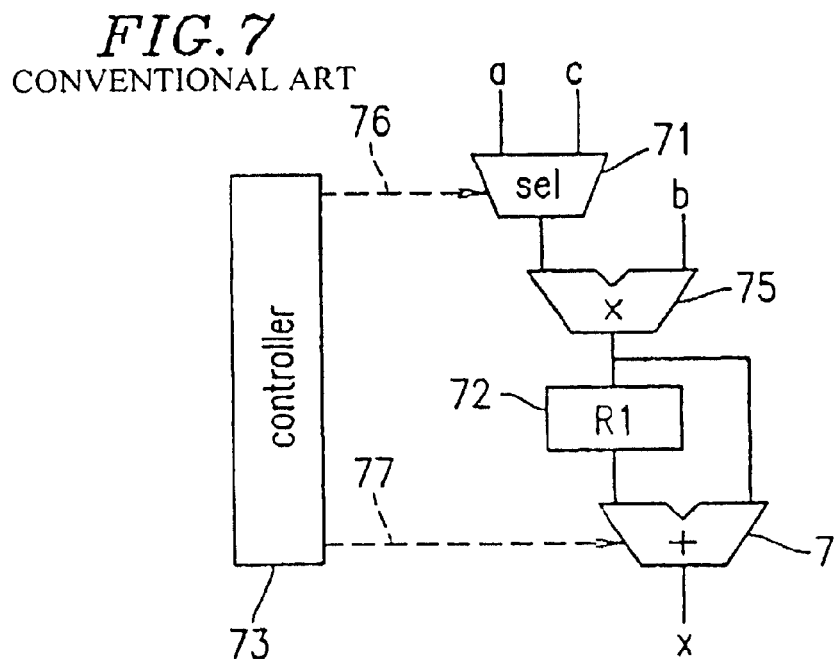
FIG. 7 is a diagram illustrating an example of a circuit obtained based on the scheduling result shown in FIG. 6.
Figure 8:
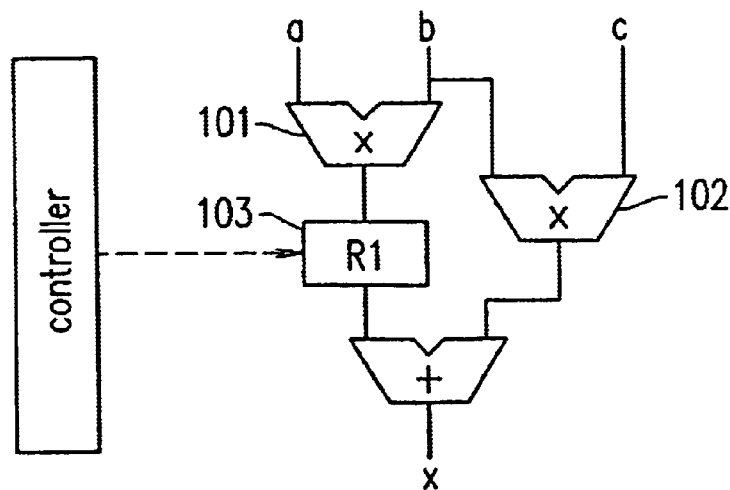
FIG. 8 is a diagram illustrating another example of the circuit obtained based on the scheduling result shown in FIG. 6.
Figure 9:
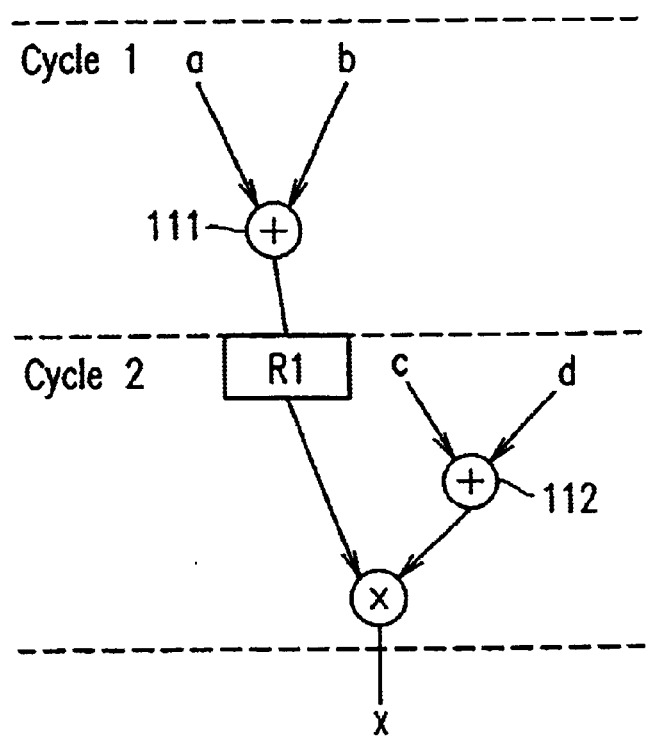
FIG. 9 is a diagram illustrating an example of a scheduling result of a conventional DFG.
Figure 10:
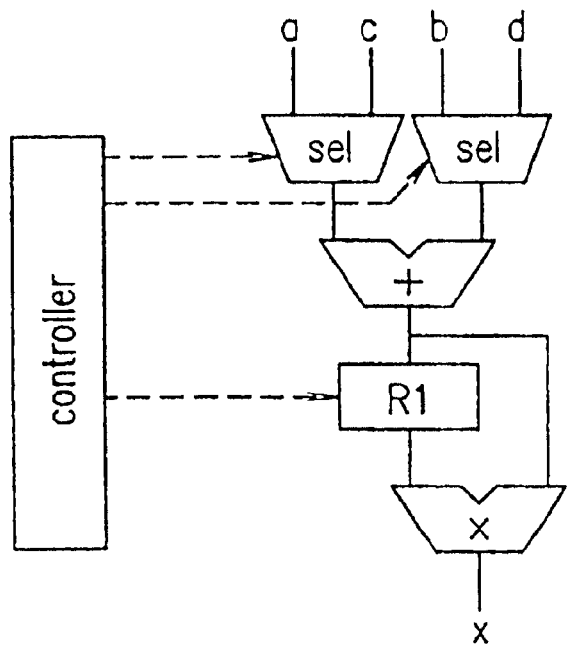
FIG. 10 is a diagram illustrating an example of a circuit obtained based on the scheduling result shown in FIG. 9.
Figure 11:
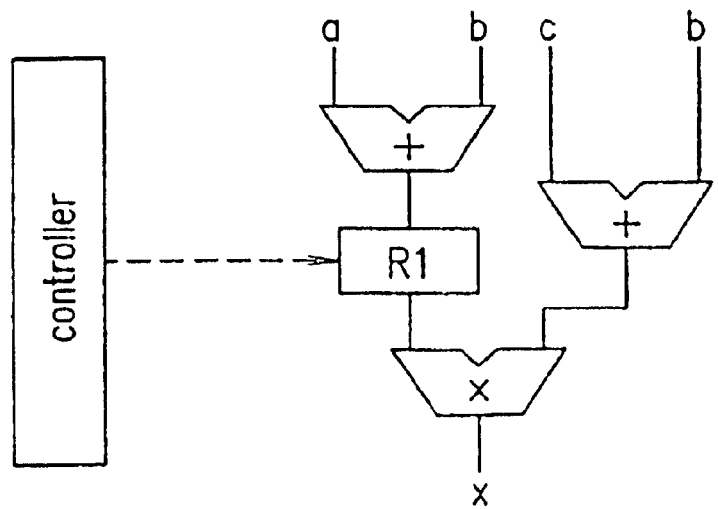
FIG. 11 is a diagram illustrating another example of the circuit obtained based on the scheduling result shown in FIG. 9.
Figure 12:
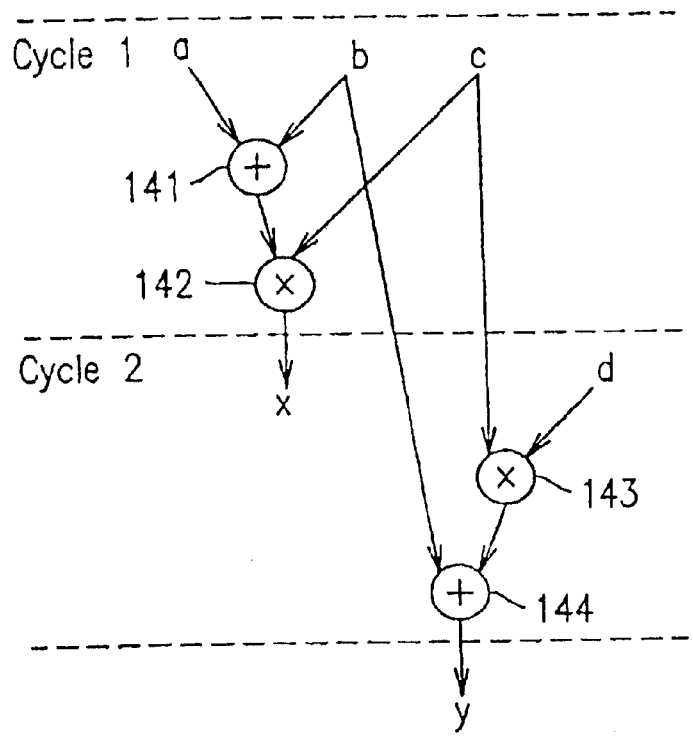
FIG. 12 is a diagram illustrating another example of the scheduling result of the conventional DFG.

Next, as step 23 of FIG. 24, a loop is detected according to the following procedure. Here, a case where arithmetic device allocation is performed on arithmetic operations in the DFG based on the scheduling result shown in FIG. 12 is described as an example.

For example, a case where the multiplications 142 and 143 are allocated to a single multiplier is examined. As shown in FIG. 13, the loop including only a combination circuit is generated only in the case where each of two or more arithmetic devices is shared between corresponding two or more operations. Therefore, the loop is not generated by merely allocating the multiplications 142 and 143 to the single multiplier.

Figure 27:
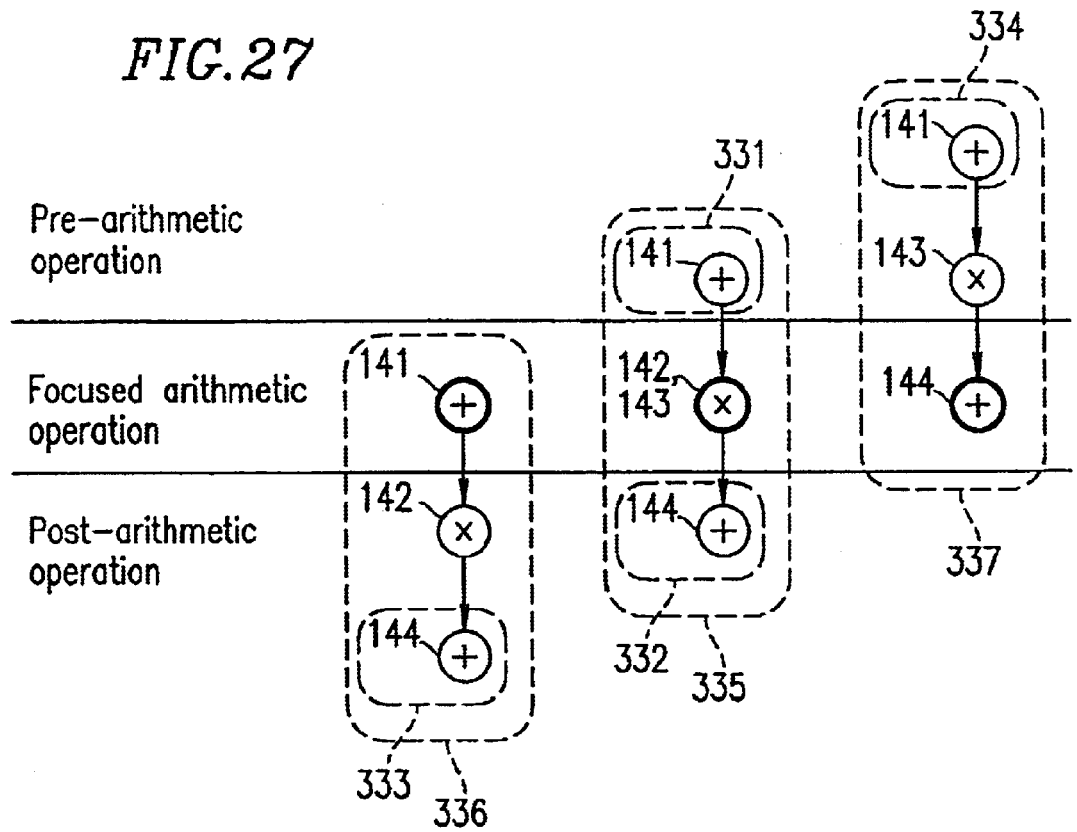
FIG. 27 is a diagram illustrating a renewal example of the pre- and post-arithmetic operations of FIG. 25.

Here, in order to estimate the influence of the allocation of the multiplications 142 and 143 to the single multiplier on allocation of the other arithmetic operations, the multiplications 142 and 143 are combined together according to the following procedure so as to change the focused arithmetic operations, pre-arithmetic operations and post-arithmetic operations as shown in FIG. 27.

Firstly, arithmetic operation units 312 and 313 shown in FIG. 25 including the multiplications 142 and 143 as their respective focused arithmetic operations are combined as a single arithmetic operation unit 335 shown in FIG. 27. As pre- and post-arithmetic operations of the arithmetic operation unit 335, the pre-arithmetic operation 141 of the operation unit 312 and the post-arithmetic operation 144 of the arithmetic operation unit 313 are connected in parallel to each other. In FIG. 25, the arithmetic operation unit 312 includes only the pre-arithmetic operation of the arithmetic operation 142, and the arithmetic operation unit 313 includes only the post-arithmetic operation of the arithmetic operation 143, and therefore the pre- and post-arithmetic operations of the arithmetic operation unit 335 shown in FIG. 27 respectively correspond to arithmetic operations 331 and 332.

Figure 29:
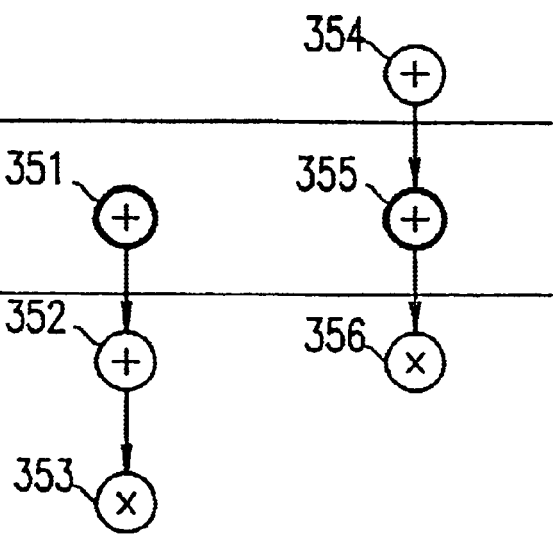
FIG. 29 is a diagram illustrating another example of the post-arithmetic operation.
Figure 30:
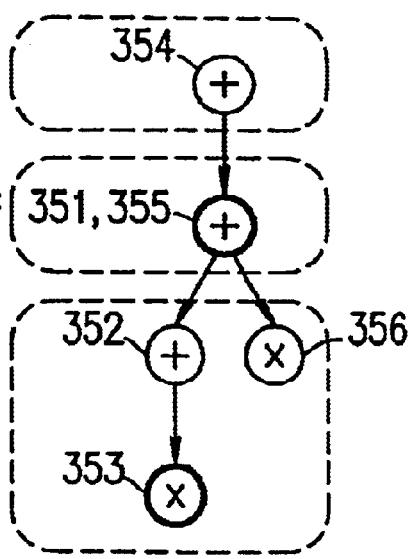
FIG. 30 is a diagram illustrating a renewal example of the pre- and post-arithmetic operations of FIG. 29.

As shown in FIG. 29, in the case where both arithmetic operations 351 and 355 which are combined with each other have post-arithmetic operations, as shown in FIG. 30, the respective post-arithmetic operations of the arithmetic operations 351 and 355 are connected in parallel to each other. This is also said of a case where both operations which are combined with each other have pre-arithmetic operations.

Next, arithmetic operation units 311 and 314 shown in FIG. 25 including the multiplications 142 and 143, which are combined together as a single multiplication, as a pre- or post-arithmetic operation are renewed so as to be arithmetic operational units 336 or 337, respectively, as shown in FIG. 27. As in the case of the arithmetic operation unit 311 of FIG. 25, when the multiplication 142 is the post-arithmetic operation, a post-arithmetic operation 332 newly added to the arithmetic operation unit 335 of FIG. 27 is further added to the arithmetic operation unit 336 as a post-arithmetic operation 333. Further, as in the case of the arithmetic operation unit 314 of FIG. 25, when the multiplication 143 is the pre-arithmetic operation, a pre-arithmetic operation 331 newly added to the arithmetic operation unit 335 of FIG. 27 is further added to the arithmetic operation unit 337 as a pre-arithmetic operation 334.

Next, a case where the additions 141 and 144 of the scheduling result shown in FIG. 12 are allocated to a single adder after the multiplications 142 and 143 are allocated to a single multiplier is examined. The pre- and post-arithmetic operations after the allocation of the multiplications 142 and 143 are as shown in FIG. 27.

In this case, the condition that the loop including only a combination circuit is generated is as follows. In the case where arithmetic operations B and C are allocated to an arithmetic device A, when the operation B is a focused arithmetic operation, the operation C is a pre- or post-arithmetic operation of the operation B, or when the operation C is a focused arithmetic operation, the operation B is a pre- or post-arithmetic operation of the arithmetic operation C.

In the case where the additions 141 and 144 are allocated to a single adder, in FIG. 27, when the addition 141 is a focused arithmetic operation, post-arithmetic operations thereof include the addition 144, and when the addition 144 is a focused arithmetic operation, pre-arithmetic operations of the addition 144 include the addition 144. Therefore, it is appreciated that the allocation of the additions 141 and 144 to a single arithmetic device results in the loop including only a combination circuit.

At step 23 of FIG. 24, it is determined whether or not the loop including only a combination circuit is generated when a plurality of arithmetic operations are allocated to a single arithmetic device using the method described above. When the loop including only a combination circuit is not generated, the process proceeds to step 25 so as to allocate the plurality of arithmetic operations to a single arithmetic device, and at step 26, the pre- and post-arithmetic operations are renewed. On the other hand, when the loop including only a combination circuit is generated, the process proceeds to step 24 so as to separately allocate the plurality of arithmetic operations to different arithmetic devices.

Figure 28:
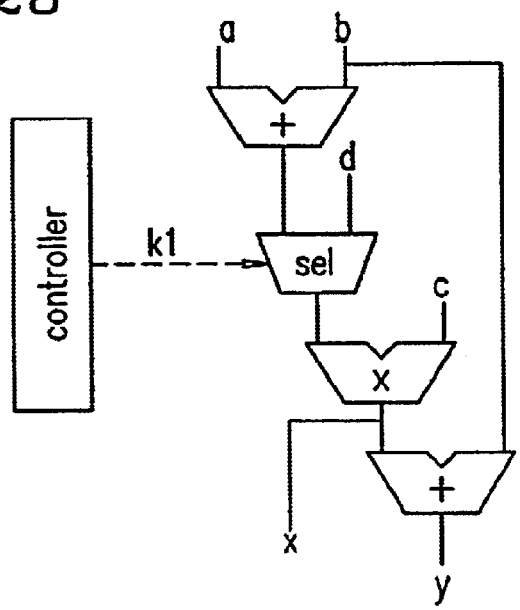
FIG. 28 is a diagram illustrating an example of a circuit which does not include a loop including only a combination circuit.

In the example shown in FIG. 27, the allocation of the additions 141 and 144 to a single adder results in the loop including only a combination circuit, and therefore in order to avoid this, the additions 141 and 144 are only required to be separately allocated to two different adders. In this case, the resultant circuit is as shown in FIG. 28. The circuit of FIG. 28 includes: an adder for adding inputs a and b; a selector for selecting one of an output of the adder and input d so as to output the selection result; a multiplier for multiplying the output of the selector and input c together so as to output the multiplication result to a downstream adder or output an arithmetic operation result x; the downstream adder for adding the output of the multiplier and input b together so as to output an arithmetic operation result y; and a controller for outputting a signal k1 to control the selector. The circuit of FIG. 28 does not include the loop 156 including only a combination circuit shown in FIG. 13, and therefore there is substantially no possibility that power consumption of a circuit is increased or the operation of the circuit is made unstable due to the oscillation of the circuit.

At step 27 of FIG. 24, it is determined whether or not all the arithmetic operations are allocated to their corresponding arithmetic devices. When there is any arithmetic operation left unallocated, the process returns to step 23, and when there is no arithmetic operation left unallocated, the process is ended.

It should be noted that the arithmetic device allocation design method according to Embodiment 2 can be used in combination with the arithmetic device allocation design method according to Embodiment 1. In the arithmetic device allocation design method according to Embodiment 1, a selection is made between a case where each arithmetic operation is allocated to an arithmetic device to which another arithmetic operation has already been allocated and a case where each arithmetic operation is allocated to an arithmetic device created anew, such that the entire circuit area resulting from the selected case is smaller than that resulting from the other case. Whether or not the loop including only a combination circuit is generated is determined by applying the arithmetic device allocation design method according to Embodiment 2 to the case where each arithmetic operation is allocated to an arithmetic device to which another operation has been allocated. If the loop including only a combination circuit is generated, the allocation method is not performed and each arithmetic operation is allocated to an arithmetic device created anew, thereby preventing the generation of the loop including only a combination circuit.

(Embodiment 3)

Figure 31:
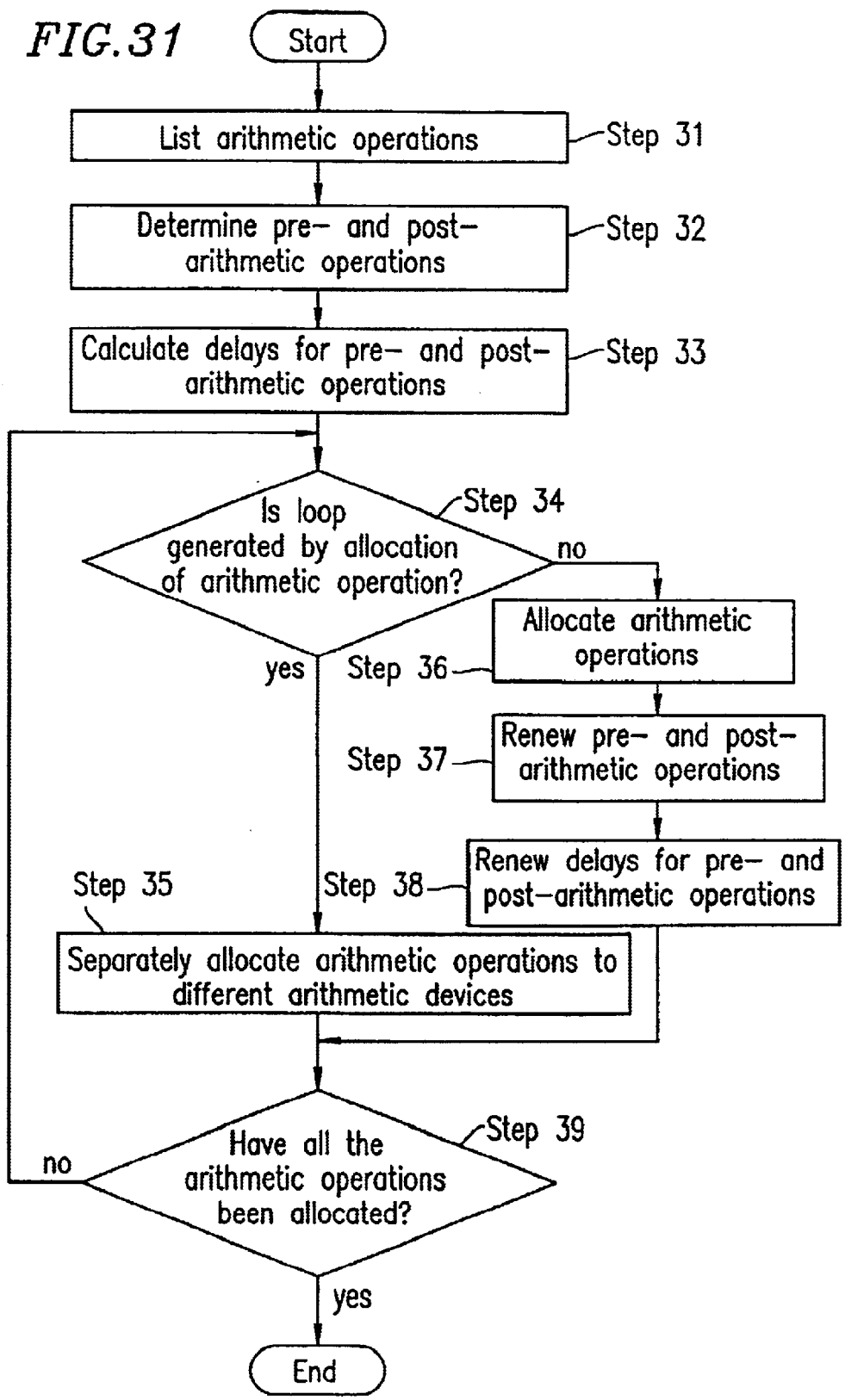
FIG. 31 is a diagram for explaining a procedure of an arithmetic device allocation design method according to Embodiment 3 of the present invention.

FIG. 31 is a flow chart for explaining an arithmetic device allocation design method according to Embodiment 3. A false path refers to a path on which no operation is actually performed, and therefore no problems are caused to a circuit itself if the false circuit is present in the circuit. However, a conventional design verification tool cannot determine whether a path is a false path or a path on which any operation is actually performed, and thus detects the false path only as an error, thereby causing problems. Embodiment 3 prevents the generation of the false path causing a delay greater than a designated value when allocating the arithmetic operations to the arithmetic devices.

Firstly, when allocating a plurality of arithmetic operations to a single arithmetic device, it is checked whether or not a false path causing a delay is greater than a designated value.

At step 31 in FIG. 31, all the arithmetic operations to be allocated to an arithmetic device are detected from the DFG based on scheduling and register allocation results so as to be listed as focused arithmetic operations. At step 32, a pre- or post-arithmetic operation is determined with respect to each focused arithmetic operation. The steps 31 and 32 can be performed in a similar manner to steps 21 and 22 shown in FIG. 24.

Next, at step 33, respective delay times of the focused arithmetic operations and pre- and post arithmetic operations are calculated. In the case where a plurality of arithmetic operations are included in each of the pre-or post-arithmetic operations, a delay time required to complete all the arithmetic operations is calculated.

Then, at step 34, a delay in the false path created when allocating the arithmetic operations A and B to a single arithmetic device is calculated using the following expression (1), (delay in false path)=max(((delay for pre-arithmetic operation of A)+(delay for A or B)+(delay for post-arithmetic operation of B)),((delay of pre-arithmetic operation for B)+(delay for A or B)+(delay for post-arithmetic operation of A)))     (1).

In this case, the arithmetic operations A and B are the same as each other, and therefore the respective delay times are the same as each other. The delay in the false path and a designated value (clock period+α) are compared, and when the delay in the false path is greater than the designated value, the false path is generated so as to cause a delay greater than the designated value.

Figure 32:
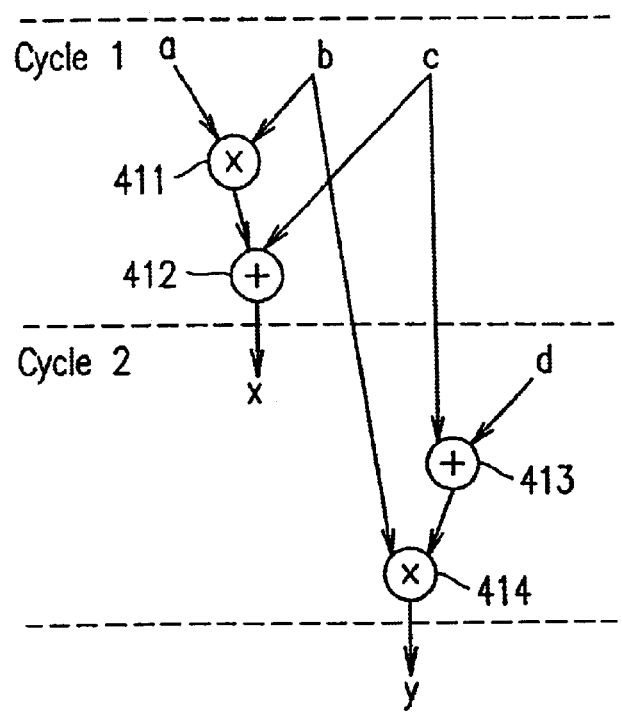
FIG. 32 is a diagram illustrating an example of a scheduling result of the DFG according to Embodiment 3 of the present invention.

A case where arithmetic operations in the DFG are allocated to arithmetic devices based on a scheduling result shown in FIG. 32 is described as an example. In this case, the delay for an operation of a multiplier is 60 ns, the delay for an operation of an adder is 5 ns, the delay for an operation of a selector is 1 ns, and a clock period is 100 ns.

In FIG. 32, inputs a and b are multiplied together (multiplication 411) and the multiplication result and input c are added together (addition 412) in cycle 1, so that an operation result x is output. Next, in cycle 2, inputs c and d are added together (addition 413) and the addition result and input b are multiplied together (multiplication 414), so that an operation result y is output.

Figure 33:
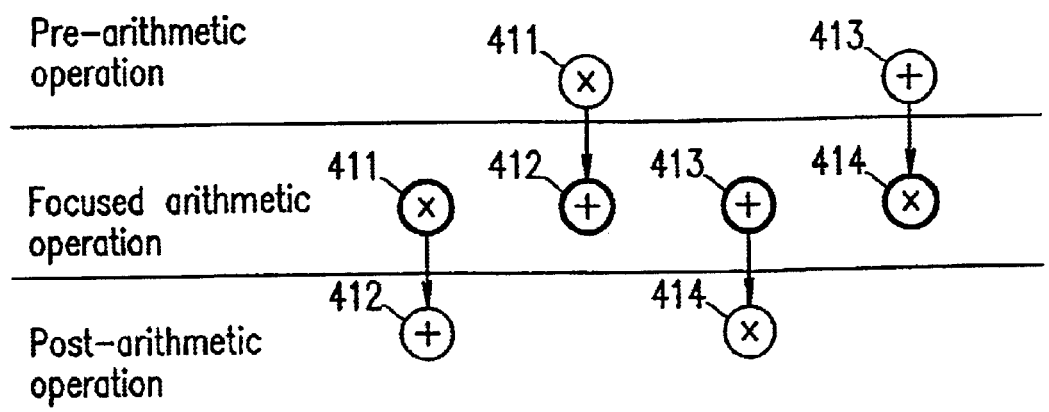
FIG. 33 is a diagram for explaining focused arithmetic operations, pre-arithmetic operations and post-arithmetic operations shown in FIG. 32.

The associated pre- or post-arithmetic operations of focused arithmetic operations 411–414 of the DFG shown in FIG. 32 are as shown in FIG. 33. Delay times of the focused arithmetic operations 411–414 and their associated pre- and post-arithmetic operations are as shown in Table 1.

TABLE 1

| Focused nodes | 411 | 412 | 413 | 414 |
| --- | --- | --- | --- | --- |
| Delay for PRAO | 0 | 60 | 0 | 5 |
| Delay for FAO | 60 | 5 | 5 | 60 |
| Delay for POAO | 5 | 0 | 60 | 0 |

*"PRAO", "FAO", and "POAO" respectively denote "pre-arithmetic operation", "Focused arithmetic operation", and "Post-arithmetic operation".

A case where the multiplications 411 and 414 shown in FIG. 32 are allocated to a single multiplier is now examined. From Table 1, the delay of the multiplication 411 is 60 ns and the delays of the pre- and post-operations thereof are 0 ns and 5 ns, respectively. Further, the delay of the multiplication 414 is 60 ns and the delays of the pre- and post-operations thereof are 5 ns and 0 ns. Therefore, according to expression (1), the delay in the false path is calculated as max (0+60+0, 5+60+5)=70 ns.

When a clock period of 100 ns is designated as a value to be compared with the delay in a false path, the delay in the false path of 70 ns is less than the designated value 100 ns, and therefore the false path generated by allocating the multiplications 411 and 414 to a single multiplier does not prevent the optimization in a logic synthesis step. The false path, if present, causes no problem since it is not generated as a data path in an actual circuit. However, when the delay in the false path is greater than a clock period (or values greater or less than the clock period), the design verification tool detects the false path as an error so that arithmetic device allocation is required to be performed again.

Figure 34:
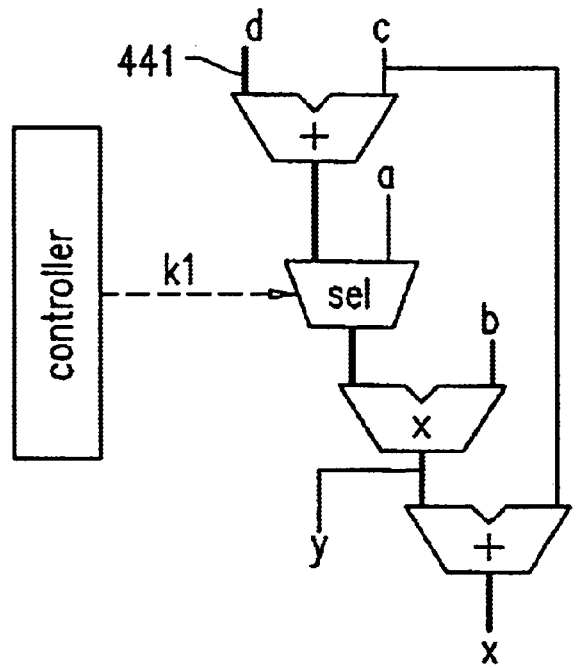
FIG. 34 is a diagram illustrating an example of a circuit obtained based on the scheduling result shown in FIG. 32.

A circuit obtained by allocating the multiplications 411 and 414 to a single multiplier and separately allocating additions 412 and 413 to different adders based on the scheduling result shown in FIG. 32 is shown in FIG. 34. The circuit of FIG. 34 includes: an adder for adding inputs d and c together; a selector for selecting one of an output of the adder and input a; a multiplier for multiplying an output of the selector and input b together so as to output the multiplication result to a downstream adder or output an arithmetic operation result y; the downstream adder for adding the output of the multiplier and input c so as to output an arithmetic operation result x; and a controller for creating a signal k1 to control the selector.

In the circuit of FIG. 34, a path 441 from input d to the arithmetic operation result x indicated by the bold line is a false path. The path 441 extends through the adder, the selector, the multiplier and the downstream adder, and therefore the sum of delays is 71 ns which is less than the designated value 100 ns corresponding to the clock period.

In Embodiment 3, when estimating the delay in the false path using the delays for the focused operations, and the delays for the pre- and post-operations as shown in Table 1, the delay for an operation of the selector (about 1 ns to 2 ns) is not considered, and therefore in consideration of the delay for an operation of the selector as a margin, a value slightly less than the clock period, e.g., 95 ns, can be designated as the value to be compared with the delay in the false path. However, when this method is used for preventing the generation of the false path, a number of operations cannot share arithmetic devices, thereby increasing the number of arithmetic devices. Therefore, a value slightly greater than the clock period, e.g., 120 ns, can be designated as the value to be compared with the delay in the false path while allowing the generation of the false path causing a delay slightly longer than the clock period.

Next, a case where the additions 412 and 413 shown in FIG. 32 are allocated to a single multiplier is examined. From Table 1, the delay for the addition 412 is 5 ns, and the delays of the pre- and post-arithmetic operations thereof are 60 ns and 0 ns, respectively. The delay for the addition 413 is 5 ns, and the delays of the pre- and post-operations thereof are 0 ns and 60 ns, respectively. Therefore, the delay in the false path is calculated as max (60+5+60, 0+5+0)=125 ns according to expression (1).

When the clock period of 100 ns is designated as the value to be compared with the delay in the false path, the delay in false path of 125 ns is greater than the designated value 100 ns, and therefore there is a possibility that the false path generated by allocating the additions 412 and 413 to a single adder might be detected as a timing error by a design verification tool in a logic synthesis step. Further, there is a possibility that the delay in the false path is optimized so as to be equal to or less than 100 ns by using the logic synthesis tool to replace an arithmetic device on the false path with another arithmetic device which is operated at a high speed but has a larger area. However, the path is a false path, and therefore such optimization is not necessary. This merely increases the circuit area.

Figure 35:
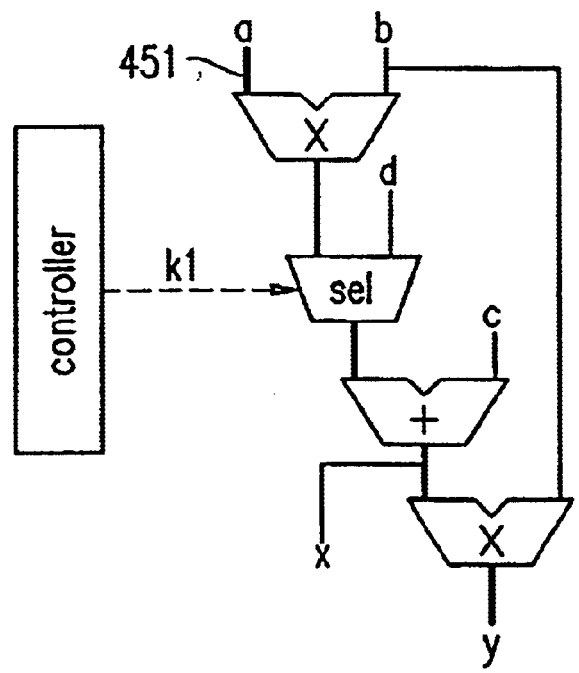
FIG. 35 is a diagram illustrating another example of a circuit obtained based on the scheduling result shown in FIG. 32.

A circuit obtained by allocating the additions 412 and 413 to a single adder and separately allocating the multiplications 411 and 414 to different arithmetic devices based on the scheduling result shown in FIG. 32 is shown in FIG. 35. The circuit of FIG. 35 includes: a multiplier for multiplying inputs a and b together; a selector for selecting one of an output of the multiplier and input d; an adder for adding an output of the selector and input c together so as to output the addition result to a downstream multiplier or output an arithmetic operation result x; the downstream multiplier for multiplying the output of the adder and input b so as to output an arithmetic operation result y; and a controller for creating a signal k1 to control the selector.

In the circuit of FIG. 35, a path 451 from input a to the arithmetic operation result y indicated the bold line is the false path. The path 451 extends through the multiplier, the selector, the adder and the downstream multiplier, and therefore the sum of delays is 126 ns which is greater than the designated value 100 ns corresponding to the clock period.

As described above, in Embodiment 3, when the arithmetic device allocation is performed based on the scheduling result shown in FIG. 32, even if the multiplications 411 and 414 are allocated to a single multiplier, a false path longer than the clock period is not generated. However, it is possible to easily detect that a false path longer than the clock period is generated by allocating the additions 412 and 413 to a single adder.

Therefore, at step 34 of FIG. 31, when the false path longer than the clock period is generated as in the case where the additions 412 and 413 are allocated to a single adder, the process proceeds to step 35 so as to separately allocate the plurality of arithmetic operations (additions 412 and 413) to different arithmetic devices. On the other hand, in the case where the false path longer than the clock period is not generated as in the case where the multiplications 411 and 414 are allocated to a single multiplier, the process proceeds to step 36 so as to allocate the plurality of arithmetic operations to a single arithmetic device and at step 37, the pre- and post-arithmetic operations of the plurality of arithmetic operations are renewed. At step 38, the delays of the pre- and post-operations are renewed correspondingly. Therefore, it is possible to prevent the generation of the false path longer than the clock period.

At step 39, it is determined whether or not all the arithmetic operations have been allocated to their corresponding arithmetic devices. When there is an arithmetic operation(s) left unallocated, the process proceeds to step 34, and when there is no operation to be allocated, the process is ended.

Figure 36:
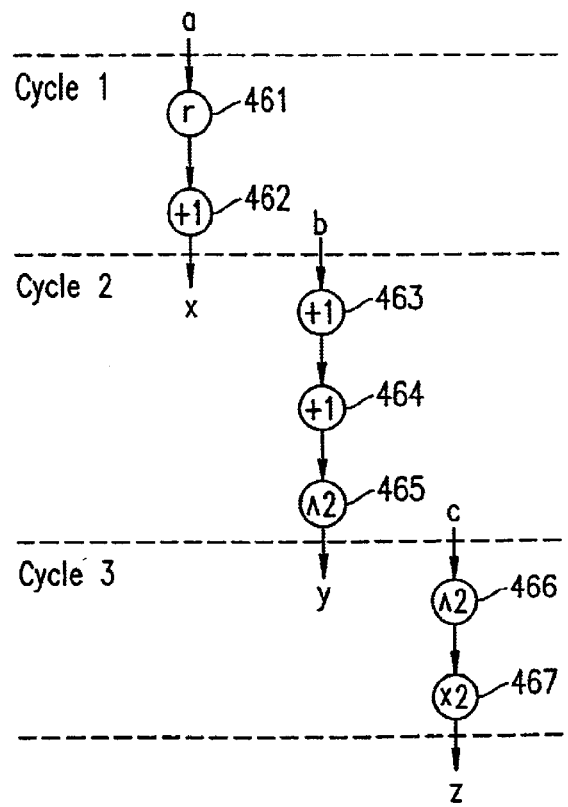
FIG. 36 is a diagram illustrating an example of a scheduling result of the DFG according to Embodiment 4 of the present invention.

Next, a case where a plurality of arithmetic operations are allocated to a plurality of arithmetic devices is described using the scheduling result shown in FIG. 36 as an example. Each arithmetic operation included in the DFG of FIG. 36 is a monadic arithmetic device to which only one input is provided. A circle including "r" therein (reference numeral 461) denotes a round-off arithmetic operation and the delay for the round-off arithmetic operation is 10 ns. Circles each including "+1" therein (reference numerals 462, 463 and 464) denote increment arithmetic operations and the delay for each increment arithmetic operation is 10 ns. Circles each including "^2" therein (reference numerals 465 and 466) denote squaring arithmetic operations and the delay for each squaring arithmetic operation is 65 ns. A circle including "×2" therein (reference numeral 467) denotes a double arithmetic operation and the delay for the double arithmetic operation is 10 ns. The clock period is 100 ns.

In FIG. 36, input a is rounded off (arithmetic operation 461) and the rounded-off result is incremented by one (arithmetic operation 462) in cycle 1, so that an arithmetic operation result x is output. Next, in cycle 2, input b is incremented by one (arithmetic operation 463) and then the incremented input b is further incremented by one (arithmetic operation 464) and is squared (arithmetic operation 465), so that an arithmetic operation result y is output. Next, in cycle 3, input c is squared (arithmetic operation 466) and then is doubled (arithmetic operation 467) so as to provide output z.

Figure 37:
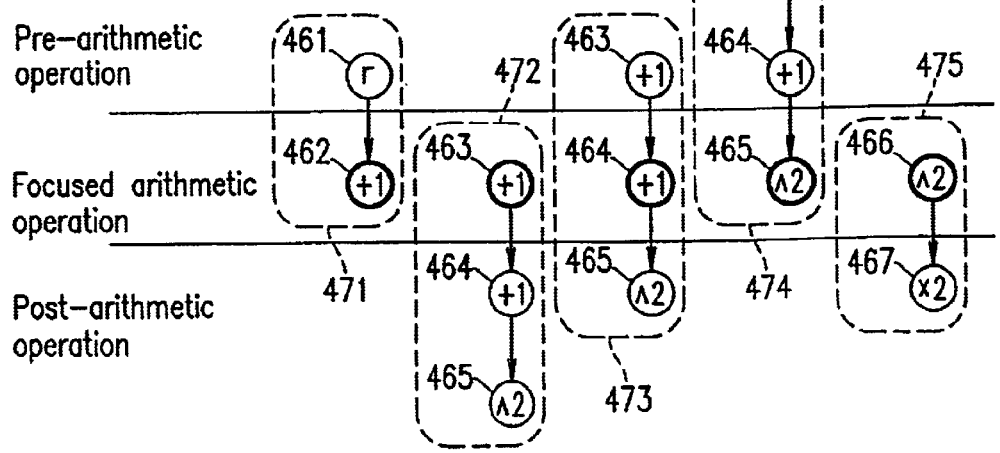
FIG. 37 is a diagram for explaining focused arithmetic operations, pre-arithmetic operations and post-arithmetic operations shown in FIG. 36.

Among the arithmetic operations included in the DFG of FIG. 36, each of the arithmetic operations 462, 463, 464, 465 and 466 can share a single arithmetic device with another arithmetic operation. When these arithmetic operations are used as focused arithmetic operations, pre- and post-operations associated with the focused arithmetic operations are as shown in FIG. 37. Delay times of the focused arithmetic operations shown in FIG. 37 and their associated pre- and post-arithmetic operations are as shown in Table 2.

TABLE 2

| Focused nodes | 462 | 463 | 464 | 465 | 466 |
|---|---|---|---|---|---|
| Delay for PRAO | 10 | 0 | 10 | 10 | 0 |
| Delay for FAO | 10 | 10 | 10 | 65 | 65 |
| Delay for POAO | 0 | 75 | 65 | 0 | 10 |

In the DFG shown in FIG. 36, the arithmetic operations 463 and 464 are performed in the same clock cycle, i.e., clock cycle 2, and therefore cannot not be allocated so as to share a single arithmetic device between them. On the other hand, arithmetic operations performed in different cycles can share a single arithmetic device, and therefore arithmetic operations 462 and 463, arithmetic operations 462 and 464, and arithmetic operations 465 and 466 are possible combinations for sharing a single arithmetic device.

According to expression (1), the delays of these combinations of the arithmetic operations are estimated to be 95 ns (arithmetic operations 462 and 463), 85 ns (arithmetic operations 462 and 464) and 85 ns (arithmetic operations 465 and 466), respectively. Therefore, it is appreciated that when a single arithmetic device is shared by any one of these combinations of the arithmetic operations, a false path exceeding the clock cycle of 100 ns cannot be generated.

Here, a case where the square arithmetic operations 465 and 466 are allocated to a single square arithmetic device is examined as an example. This allocation may change the lengths of false paths generated by the other combinations of the operations 462 and 463 and the arithmetic operations 462 and 464, and therefore the influence of the allocation of the arithmetic operations 465 and 466 to the same arithmetic device on allocation of the other arithmetic operations is reflected in Table 2, which represents the delays for pre- and post-arithmetic operations, according to a method as described below.

Figure 38:
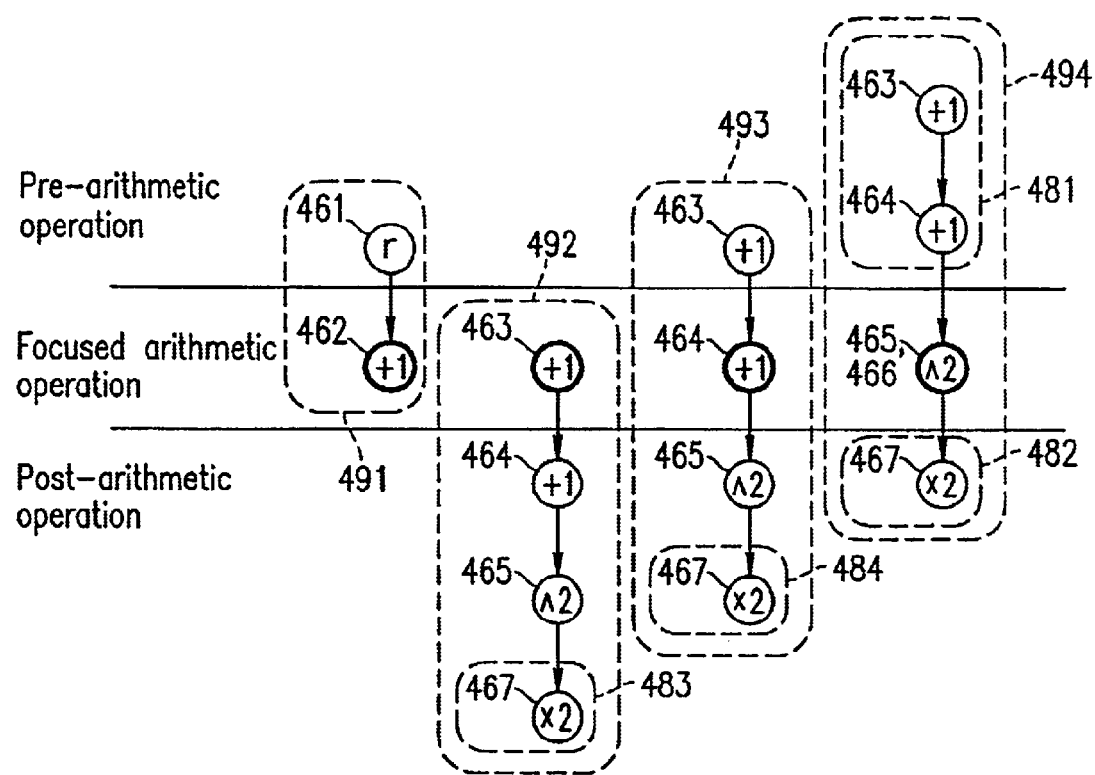
FIG. 38 is a diagram illustrating a renewal example of the pre- and post-arithmetic operations of FIG. 37.

Firstly, in order to share a single arithmetic device between arithmetic operations, the arithmetic operation 465 of an arithmetic operation unit 474 and the arithmetic operation 466 of an arithmetic operation unit 475 which are shown in FIG. 37 are combined together as an arithmetic operation unit 494 shown in FIG. 38. As pre- and post-arithmetic operations in the arithmetic operation unit 494, the pre-arithmetic operations 463 and 464 in the arithmetic operation unit 474 and the post-arithmetic operation 467 in the operation unit 475 which are shown in FIG. 37 are connected in parallel to each other. In this case, the arithmetic operation unit 474 does not have any post-arithmetic operation and the operation unit 475 does not have any pre-arithmetic operation, and therefore the pre-arithmetic operation and post-arithmetic operation in the arithmetic operation unit 494 are respectively as denoted by reference numerals 481 and 482.

In this case, as shown in FIG. 29, when both the arithmetic operations 351 and 355 which are combined together have post-arithmetic operations, these post-arithmetic operations are connected in parallel to each other as in the case of the post-arithmetic operations shown in FIG. 30. In this case, the delay for the post-arithmetic operations corresponds to a larger one of the sum of the delays for the arithmetic operations 352 and 353 and the delay for the arithmetic operation 356. This is also said for a case where both the arithmetic operations to be combined together have pre-arithmetic operations.

Next, in consideration of delay times of all the arithmetic operations, the post-arithmetic operation 482 in an arithmetic operation unit 494 shown in FIG. 38 is added to each of arithmetic operation units 472 and 473 shown in FIG. 37 each including the arithmetic operation 465 as a post-arithmetic operation so that a post-arithmetic operation 483 in an arithmetic operation unit 492 and a post-arithmetic operation 484 in a arithmetic operation unit 493 are provided. No post-arithmetic operation is added to an arithmetic operation unit 471 shown in FIG. 37, which does not include the arithmetic operation 465 as a post-arithmetic operation, and therefore the arithmetic operation unit 471 remains as it is and is shown as an arithmetic operation unit 491 in FIG. 38.

Then, Table 2 representing the delays for the pre-and post-arithmetic operations is renewed as Table 3 according to the delays for the pre- and post-arithmetic operations shown in FIG. 38.

TABLE 3

| Focused node | 462 | 463 | 464 | (465, 466) |
|---|---|---|---|---|
| Delay for PRAO | 10 | 0 | 10 | 20 |
| Delay for FAO | 10 | 10 | 10 | 65 |
| Delay for POAO | 0 | 85 | 75 | 10 |

Based on Table 3, the lengths of false paths (delays in false paths) generated when separately allocating the combination of the arithmetic operations 462 and 463 and the combination of the arithmetic operations 462 and 464 to their respective common arithmetic devices are estimated again using expression (1). The estimated delays in these false paths are 105 ns and 95 ns, respectively. From this estimation, it is appreciated that when the arithmetic operations 462 and 463 are allocated to a single arithmetic device, a false path longer than the clock period of 100 ns is generated, and when the arithmetic operations 462 and 464 are allocated to a single arithmetic device, a false path longer than the clock period of 100 ns is not generated.

As described above, according to Embodiment 3, in the estimation performed before allocating the arithmetic operations 465 and 466 to a single arithmetic device, it is detected that even if the arithmetic operations 462 and 463 are allocated to a single arithmetic device, a false path longer than the clock period of 100 ns is not generated. However, in the estimation performed after allocating the arithmetic operations 465 and 466 to a single arithmetic device, it is detected that a false path longer than the clock period of 100, ns is created due to the influence of the allocation of the arithmetic operations 465 and 466.

Figure 39:
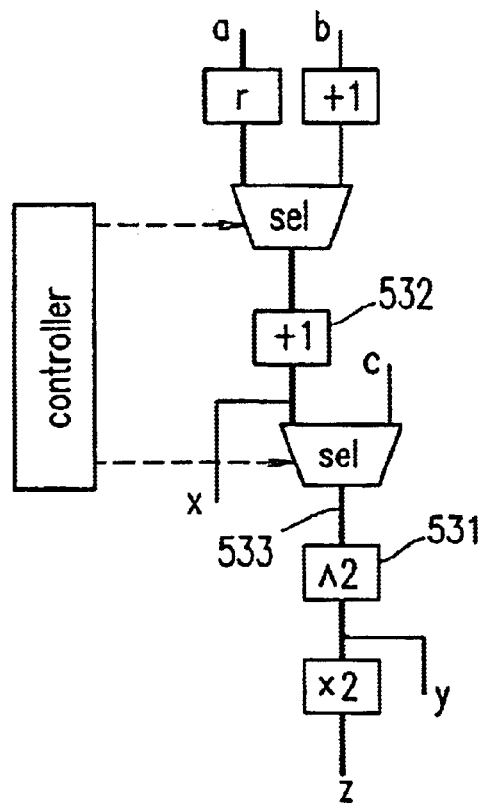
FIG. 39 is a diagram illustrating an example of a circuit obtained based on the scheduling result shown in FIG. 36.

A circuit obtained by allocating the arithmetic operations 465 and 466 to a single arithmetic device and further allocating the operations 462 and 464 to a single arithmetic device based on the scheduling result shown in FIG. 36 is shown in FIG. 39. The circuit of FIG. 39 includes: a round-off arithmetic device for rounding off input a to the nearest whole number; an adder for incrementing input b by one; a selector for selecting one of outputs of the round-off arithmetic device and the adder; an adder 532 for incrementing an output of the selector by one so as to output the increment result to a downstream selector or to output an arithmetic operation result x; the downstream selector for selecting one of the output of the adder 532 and input c; a square arithmetic device 531 for squaring the output of the downstream selector so as to output the squared result to a double arithmetic device or to output an arithmetic operation result y; the double arithmetic device for doubling the output of the square arithmetic device 531 so as to provide output z; and a controller for creating a signal to control the selector.

In the circuit of FIG. 39, the arithmetic device 531 performs the arithmetic operations 465 and 466 (FIG. 36), and the arithmetic device 532 performs the arithmetic operations 462 and 464 (FIG. 36). The longest false path included in the circuit of FIG. 39 is a path 533 from input a to output z indicated by the bold line. The path 533 extends through the round-off arithmetic device, the adder, the square arithmetic device, the double arithmetic device and two selectors. When the delay for an operation of the selector is 1 ns, the sum of delays caused by these arithmetic devices located on the path 533 is calculated as 10+10+65+10+2=97 ns which is smaller than the clock period of 100 ns.

As described above, by using the arithmetic device allocation method according to Embodiment 3, it is possible to perform arithmetic device allocation without unnecessary timing error due to a false path being detected by a design verification tool and unnecessary optimization of the false path being performed by a logic synthesis tool in a logic synthesis step.

It should be noted that the arithmetic device allocation design method according to Embodiment 3 can be used in combination with the arithmetic device allocation design method according to Embodiment 1. In the arithmetic device allocation design method according to Embodiment 1, a selection is made between a case where each arithmetic operation is allocated to an arithmetic device to which another arithmetic operation has already been allocated and a case where each arithmetic operation is allocated to an arithmetic device created anew, such that the entire circuit area resulting from the selected case is smaller than that resulting from the other case. Whether or not a false path greater than a designated value is generated is determined by applying the arithmetic device allocation design method according to Embodiment 3 to the case where each arithmetic operation is allocated to an arithmetic device to which another operation has been allocated. If a false path greater than the designated value is generated, the allocation method is not performed and each operation is allocated to an arithmetic device created anew, thereby preventing the generation of a false path greater than the designated value.

(Embodiment 4)

Embodiment 4 of the present invention is described with respect to a method for sequentially allocating arithmetic operations in the DFG to arithmetic devices based on a scheduling result in which the arithmetic device allocation is performed so as to begin with an arithmetic operation using an arithmetic device having a large area and end with an arithmetic operation using an arithmetic device having a small area.

Figure 15:
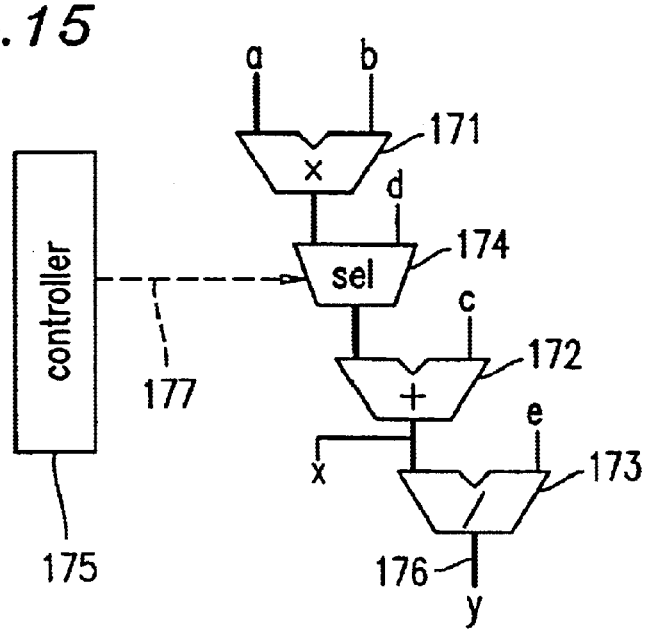
FIG. 15 is a diagram for explaining a false path.

Here, a case where the arithmetic device allocation is performed based on the scheduling result shown in FIG. 12 is examined as an example. In the DFG shown in FIG. 12, the additions 141 and 144 are allocated to a single adder and the multiplications 142 and 143 are allocated to a single multiplier, as shown in FIG. 15, the loop including only a combination circuit is generated, and therefore circuit malfunction may be caused.

In the method described in conjunction with Embodiment 2, for example, when attempting the allocation of the additions 141 and 144 to a single adder after allocating the multiplications 142 and 143 to a single multiplier, the loop including only a combination circuit is generated, and therefore by separately allocating the additions 141 and 144 to two different adders, the circuit shown in FIG. 28 which does not have a loop including only a combination circuit is generated.

Figure 40:
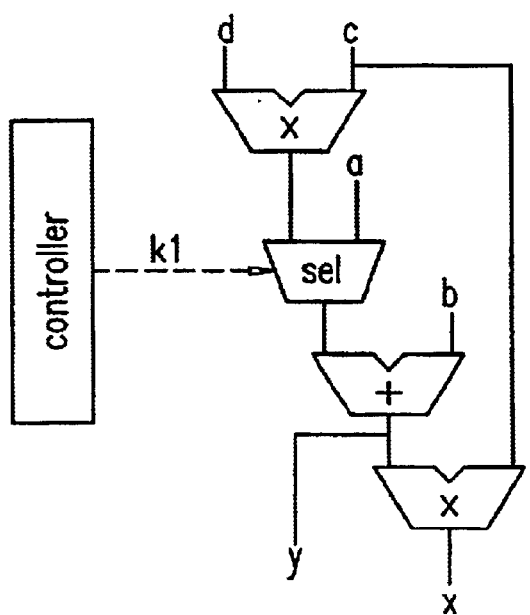
FIG. 40 is a diagram illustrating an example of a circuit obtained based on the scheduling result shown in FIG. 12.

In this case, when attempting the allocation of the multiplications 142 and 143 to a single multiplier after allocating the additions 141 and 144 to a single adder in a similar manner to the method of Embodiment 2, the circuit shown in FIG. 40 in which the additions 141 and 144 are allocated to a single adder and the multiplications 142 and 143 are separately allocated to two different multipliers is generated.

The circuits of FIGS. 28 and 40 perform similar processes. However, the circuit of FIG. 28 includes two adders and one multiplier while the circuit of FIG. 40 includes one adder and two multipliers. In general, an area of a multiplier is more than several times the area of an adder, and therefore the circuit of FIG. 40 has a larger area than the circuit of FIG. 28.

In Embodiment 4, the arithmetic device allocation is sequentially performed from an arithmetic operation using an arithmetic device having a large area, and therefore allocation of arithmetic operations to arithmetic devices having a small area is performed after allocating the arithmetic operation using the arithmetic device having a large area. Therefore, in order to prevent the generation of the loop including only a combination circuit using the method according to Embodiment 2, a plurality of arithmetic operations are separately allocated to arithmetic devices having a large area and another plurality of arithmetic operations are separately allocated to a plurality of arithmetic devices having a small area. Therefore, the arithmetic device allocation performed based on the scheduling result shown in FIG. 12 results in the circuit of FIG. 28 but does not result in the circuit of FIG. 40. In this manner, according to Embodiment 4, it is possible to minimize an increase in area of an arithmetic device caused by preventing the generation of the loop including only a combination circuit, thereby obtaining a circuit having a small area.

It should be noted that the arithmetic device allocation design method of Embodiment 4 can be used in combination with the arithmetic device allocation method of Embodiment 3. In the arithmetic device allocation design method according to Embodiment 3, in the case of allocating a plurality of arithmetic operations to a single arithmetic device and then allocating another plurality of arithmetic operations to another single arithmetic device, when it is determined that a false path greater than a designated value is generated, arithmetic operations are separately allocated to different arithmetic devices rather than sharing one arithmetic device between the arithmetic operations. In this case, the arithmetic device allocation design method according to Embodiment 4 is applied so as to sequentially perform arithmetic device allocation from an arithmetic operation using an arithmetic devices having a large area. This increases arithmetic devices having a relatively small area even in the case where arithmetic operations are separately allocated to different arithmetic devices, rather than sharing the arithmetic device between the arithmetic operations, so as to prevent the generation of a false path greater than a designated value. Therefore, it is possible to minimize an increase in circuit area, thereby obtaining a circuit having a small area.

As described in detail above, according to the present invention, unlike the conventional arithmetic device allocation design methods, it is possible to obtain an arithmetic device allocation result which makes the total area of an arithmetic device and a selector to be small, so as not to cause an increase in the entire area of a circuit due to employment of a small number of arithmetic devices and a large number of selectors or employment of a large number of arithmetic devices for reducing the number of selectors.

Further, according to the present invention, it is possible to prevent the generation of the loop extending through only a combination circuit, and therefore it is possible to prevent an increase of power consumption due to oscillation of the circuit or to prevent circuit malfunction. Furthermore, it is possible to precisely estimate the delays in the steps of logic synthesis, floor planning, routing of layout, etc.

Further still, according to the present invention, it is possible to prevent the generation of a false path greater than a designated value such that timing error is not generated or unnecessary optimization is not performed even when a conventional design verification tool or a logic synthesis tool is used.

Further still, according to the present invention, it is possible to minimize an increase in a circuit area in the cases where an arithmetic device is added so as to reduce the number of selectors, prevent the generation of the loop including only a combination circuit, prevent the generation of a false path equal to or more than a designated period, or the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An arithmetic device allocation design method for allocating arithmetic operations in a data flow graph, which includes a branch and a node respectively representing a flow of data and an arithmetic operation, to an arithmetic device based on a scheduling result when performing high-level synthesis for synthesizing a circuit from behavioral descriptions which do not include information about hardware structures and only include a processing algorithm, the method comprising the steps of:

in the case of allocating an arithmetic operation A to the arithmetic device, comparing an increased circuit area due to a selector to be provided so as to allocate the arithmetic operation A to an arithmetic device C to which another arithmetic operation B has already been allocated and an increased area due to an arithmetic device D to be created anew to which only the arithmetic operation A is allocated;

based on said comparing step, when the increased circuit area due to the selector is smaller than the increased area due to the arithmetic device D, allocating the arithmetic operation A to the arithmetic device C to which the another arithmetic operation B has already been allocated while providing the selector; and based on said comparing step, when the increased circuit area due to the arithmetic device D is smaller than the increased area due to said selector, creating the arithmetic device D anew so as to allocate the arithmetic operation A to the arithmetic device D created anew.

2. An arithmetic device allocation design method according to claim 1, wherein the arithmetic operation allocation is sequentially performed from an arithmetic operation using an arithmetic device having a large area.

* * * * *